(12) United States Patent
Hirohata et al.

(10) Patent No.: US 7,852,628 B2
(45) Date of Patent: Dec. 14, 2010

(54) COOLING DEVICE AND ELECTRONIC APPARATUS HAVING THE COOLING DEVICE

(75) Inventors: Kenji Hirohata, Koto-ku (JP); Katsumi Hisano, Matsudo (JP); Kenji Ooki, Yokohama (JP); Hideo Kitamura, Yokohama (JP); Tomonao Takamatsu, Nerima-ku (JP); Takahiro Omori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 12/402,702

(22) Filed: Mar. 12, 2009

(65) Prior Publication Data
US 2009/0244843 A1 Oct. 1, 2009

(30) Foreign Application Priority Data
Mar. 25, 2008 (JP) .............................. 2008-078339

(51) Int. Cl.
*H05K 7/20* (2006.01)
(52) U.S. Cl. ........................ 361/695; 361/694; 361/696
(58) Field of Classification Search ........................ None
See application file for complete search history.

(56) References Cited

U.S. PATENT DOCUMENTS

| 6,496,369 | B2 | 12/2002 | Nakamura | |
|---|---|---|---|---|
| 7,345,874 | B2 * | 3/2008 | Cheng et al. | 361/695 |
| 7,643,295 | B2 * | 1/2010 | Chao et al. | 361/700 |
| 2007/0058346 | A1 * | 3/2007 | Yeh | 361/697 |
| 2007/0131383 | A1 * | 6/2007 | Hattori et al. | 165/11.2 |

FOREIGN PATENT DOCUMENTS

| JP | 2002-016200 | 1/2002 |
|---|---|---|
| JP | 2007-189183 | 7/2007 |

* cited by examiner

*Primary Examiner*—Gregory D Thompson
(74) *Attorney, Agent, or Firm*—Turocy & Watson, LLP

(57) ABSTRACT

A cooling device including: a fan configured to rotate and produce airflow; a fan case accommodating the fan, the fan case having an outlet for discharging the airflow produced by the fan; a heat exchanger having an inlet disposed to oppose the outlet of the fan case, the inlet being configured to take in the airflow discharged from the outlet; a wire disposed between the heat exchanger and the fan case to stretch along an end face of the inlet of the heat exchanger, the wire having a first end being fixed to a fulcrum and a second end; and a wire driving mechanism configured to swing the wire about the fulcrum to scrape the end face of the inlet of the heat exchanger by the wire.

9 Claims, 18 Drawing Sheets

COOLING DEVICE AND ELECTRONIC APPARATUS HAVING THE COOLING DEVICE

CROSS REFERENCE TO RELATED APPLICATION(S)

The present disclosure relates to the subject matters contained in Japanese Patent Application No. 2008-078339 filed on Mar. 25, 2008, which are incorporated herein by reference in its entirety.

FIELD

The present invention relates to a cooling device and an electronic apparatus having the cooling device.

BACKGROUND

As a cooling device, which cools a heat generating portion of an electronic apparatus, there is widely used a mechanism having: a heat receiving portion (heat spreader) which is thermally connected to the heat generating portion; a heat transporting member (heat pipe) in which one end portions is connected to the heat receiving portion; a heat exchanging portion (cooling fins) which is disposed in the other end portion of the heat transporting member; and air blower (cooling fan) for cooling the heat exchanging portion.

In an electronic apparatus such as a notebook personal computer, a cooling device which cools a semiconductor package is accommodated in a case. The cooling device is configured by a heat spreader, a heat pipe, a heat exchanging portion, and a fan unit. The heat exchanging portion has a plurality of thin plate-like fins in each of which a through hole is formed, and which are stacked at intervals of about several millimeters. A heat radiating end portion of the heat pipe is passed through the through holes of the fins, and thermally connected to the fins. The fan unit has a fan case having an inlet and an outlet, and a fan which is rotationally driven by a motor housed in the fan case. When the fan is rotated, the fan unit suctions the air in the axial direction of the fan, and discharges the sucked air in the centrifugal direction of the rotation.

When the heat exchanging portion is viewed toward the front side from the interior of the fan case, the heat exchanging portion shows an appearance in which end edges of the fins upstand and are arranged in multiple layers in a horizontal direction. FIG. 26 shows positional relationships between the heat exchanging portion and the fan unit, and a blowing air passage in the case where the heat exchanging portion and the fan unit are viewed from the upper side. In the heat exchanging portion 90, the fins 91 are located in the side of a fan outer peripheral portion 92 along the arrangement direction of the fins 91. In the fan case 94 of the fan unit 93, the blowing air passage is formed so that the air is blown from the fan outer peripheral portion 92 in the centrifugal direction of the rotation on a horizontal plane. An outlet 95 for the cooling air from the blowing air passage is opened in the end edges 96 of the fins 91 on the side of the air inlet side. The speed of the air flow flowing through the gap between two fins 91 which are positioned in the right side in the figure among the fins 91 is higher than that of the air flow flowing through the gap between two fins 91 which are positioned in the left side. Dusts contained in the cooling air easily adhere to the end edges 96 of the fins 91 of the right side. In the plane including the end edges 96, a portion 97 where dusts easily accumulate is positioned in the right side of the plane, in the case where the plane is viewed in the direction from the fan unit 93 toward the heat exchanging portion 90. Dusts first begin to accumulate in the portion 97. In the vicinity of the cooling device of the electronic apparatus, dusts accumulate during use, and there is a case where the dusts clog the air passage and the cooling performance of the apparatus is impaired.

In a notebook personal computer, the thickness of the case must be suppressed. In a state where a cooling device is disposed on a circuit board, the installation dimension of the cooling device is limited by the thickness of a case. The dimensions of a cooling fan and a heat exchanger are determined so that their heights and the unit height are reduced in the thickness direction of the case. Conventionally, an electronic apparatus is known in which, while satisfying requirements for reductions of the size and the weight, the efficiency of the heat control is improved so as to contribute to enhancement of the performance efficiency. An example of such electronic apparatus is disclosed in Japanese Patent No. 3,302,350 (counterpart U.S. publication is: U.S. Pat. No. 6,496,369 B2).

In a notebook personal computer, however, the space in the case is very limited, and the thickness of the case is restricted. In the example of FIG. 26, it is difficult to dispose a device for removing dusts adhering to the end edges 96 of the fins 91, between the heat exchanging portion 90 and the fan unit 93, because the space in the case is narrow, and the cooling air passage is blocked to increase the air flow resistance.

SUMMARY

According to a first aspect of the present invention, there is provided a cooling device including: a fan configured to rotate and produce airflow; a fan case accommodating the fan, the fan case having an outlet for discharging the airflow produced by the fan; a heat exchanger having an inlet disposed to oppose the outlet of the fan case, the inlet being configured to take in the airflow discharged from the outlet; a wire disposed between the heat exchanger and the fan case to stretch along an end face of the inlet of the heat exchanger, the wire having a first end being fixed to a fulcrum and a second end; and a wire driving mechanism configured to swing the wire about the fulcrum to scrape the end face of the inlet of the heat exchanger by the wire.

According to a second aspect of the present invention, there is provided an electronic apparatus including: a case comprising a side wall in which an air discharge port is formed; and a cooling device provided in the case, the cooling device including: a fan configured to rotate and produce airflow; a fan case accommodating the fan, the fan case having an outlet for discharging the airflow produced by the fan; a heat exchanger disposed near the air discharge port and having an inlet disposed to oppose the outlet of the fan case, the inlet being configured to take in the airflow discharged from the outlet; a wire disposed between the heat exchanger and the fan case to stretch along an end face of the inlet of the heat exchanger, the wire having a first end being fixed to a fulcrum and a second end; and a wire driving mechanism configured to swing the wire about the fulcrum to scrape the end face of the inlet of the heat exchanger by the wire.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

Figure 1:
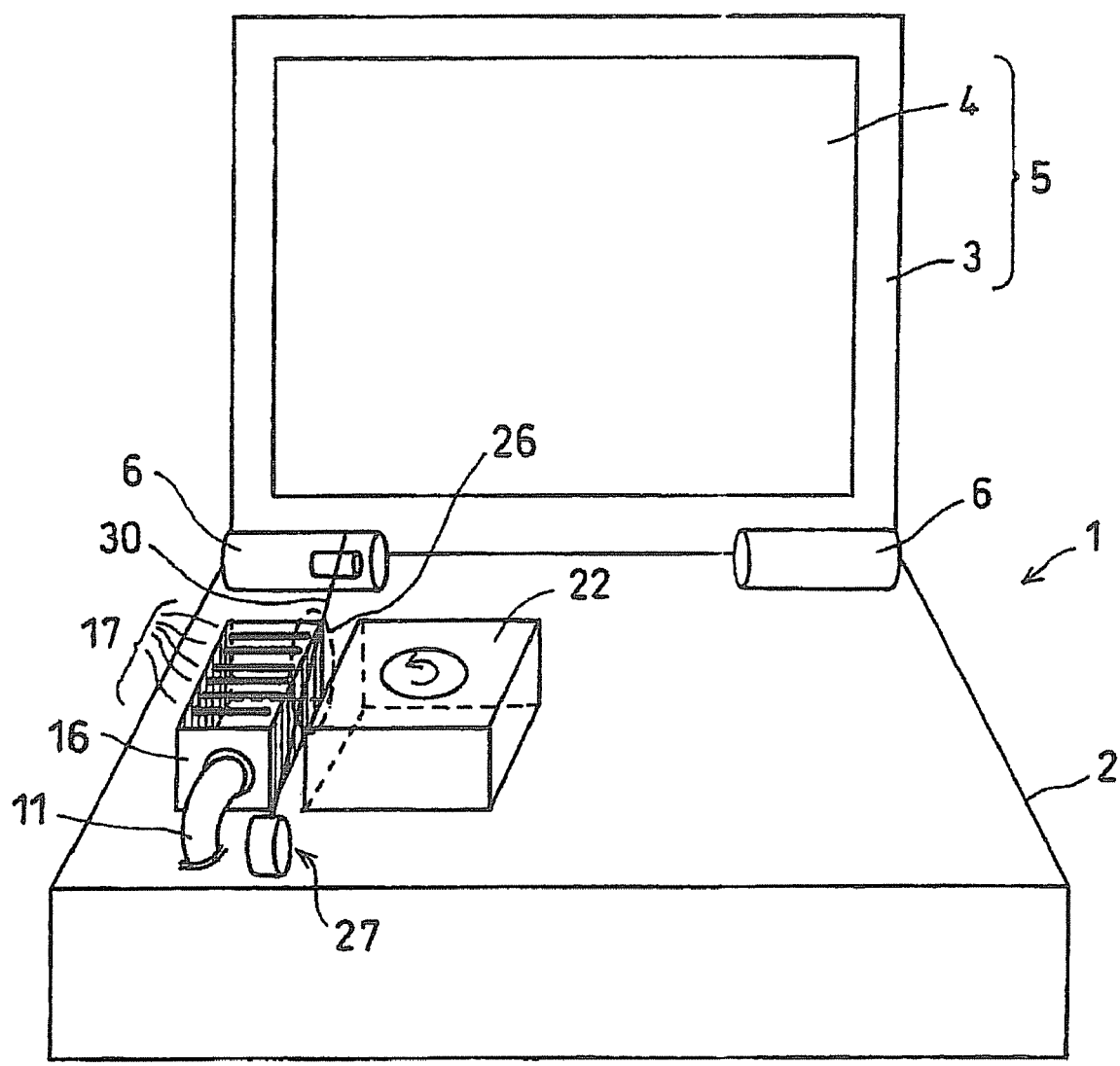
FIG. 1 is a perspective view of a dust removing mechanism disposed in an electronic apparatus of a first embodiment of the invention, as viewed toward the front.

Hereinafter, a cooling device according to embodiments of the invention, and an electronic apparatus having the cooling device will be described with reference to FIGS. 1 to 25. In the figures, the identical components are denoted by the same reference numerals, and duplicated description is omitted.

First Embodiment

A cooling device according to a first embodiment of the invention is disposed in an electronic apparatus, blows cooling air to a heat generating portion in the electronic apparatus, and discharges the cooling air to the outside of the electronic apparatus, whereby heat radiation is forcedly performed. The cooling device includes: a heat spreader which is thermally connected to a semiconductor package; a heat pipe in which one end portions is connected to the heat spreader in a thermally conductive manner; a heat exchanging portion which is disposed in the other end portion of the heat pipe, and which has a plurality of fins for receiving heat of the heat spreader that is transported by the heat pipe; a cooling fan which cools the fins; and a dust removing mechanism which removes dusts adhering to the fins, by means of cooling air that is blown from the cooling fan to the plural fins. The dust removing mechanism is configured by a wire, and wire driving mechanism for driving the wire. The electronic apparatus having the cooling device of the embodiment is a notebook personal computer (notebook PC) having the cooling device. The electronic apparatus may be a laptop PC or a note-type PC.

FIG. 1 is a perspective view of the dust removing mechanism disposed in the notebook personal computer, as viewed toward the front, and shows the interior of the case in a state where a keyboard and a palm rest are removed. The reference numeral 11 denotes the heat pipe which is connected to the heat spreader that is not shown, 16 denotes the heat exchanging portion which functions as a heat exchanger, and 22 denotes a cooling fan unit for air cooling. The reference numeral 27 denotes the dust removing mechanism which is placed between the heat exchanging portion 16 and the fan unit 22. The cooling device having the dust removing mechanism is configured by the heat spreader, the heat pipe 11, the heat exchanging portion 16, the fan unit 22, and the dust removing mechanism 27.

The electronic apparatus 1 has: a box-shaped case 2 which accommodates the computer body; a display case 3 which is supported by the case 2; and a display unit 5 configured by a display 4 which is accommodated in the display case 3. The display case 3 is coupled to the upper wall of the case 2 through a pair of hinge portions 6.

Figure 2:
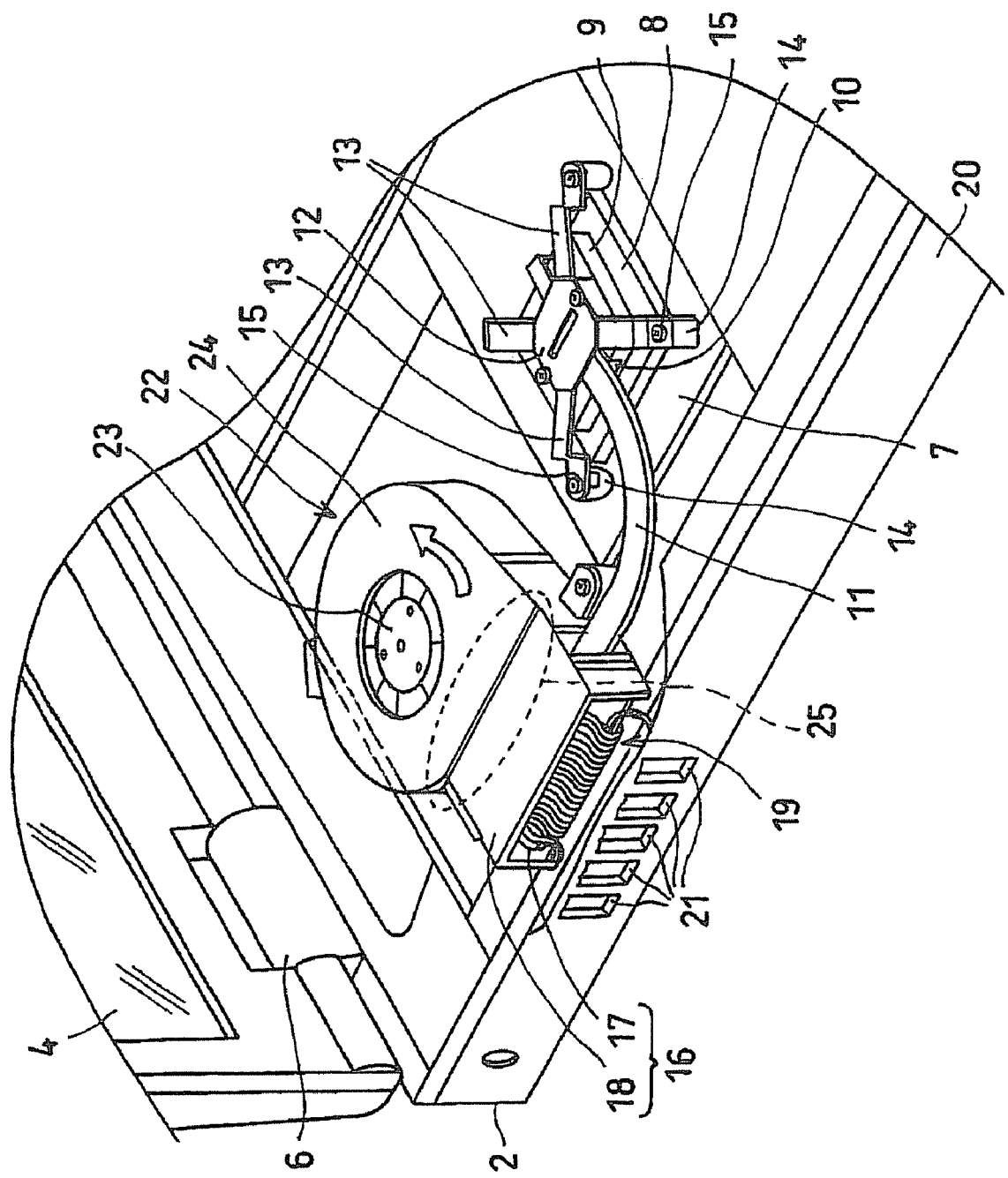
FIG. 2 is a perspective view of a cooling device of the first embodiment of the invention, and a portion where a semiconductor package is disposed on a circuit board.

FIG. 2 is a perspective view of the cooling device and a portion where the semiconductor package are disposed on a circuit board, and shows the interior of the case 2 in the state where the dust removing mechanism 27 is removed. The semiconductor package 8 which is a heat generation component is disposed on the printed circuit board 7 accommodated in the case 2. The semiconductor package 8 constitutes a microprocessor, and has an IC chip which is a heat generating member that generates a large amount of heat. The heat spreader 9 is a metal member which is formed into a rectangular plate-like shape, and integrated with the semiconductor package 8 by bonding or joining. A groove 10 is openly formed in a middle portion of one side face, i.e., the upper face of the heat spreader 9. One end portion of the heat pipe 11 is fitted into the groove 10, and crimped thereto.

A rectangular pressing plate 12 which presses the heat spreader 9 against the printed circuit board 7 in a state where the heat pipe 11 is interposed therebetween is attached to one side face of the heat spreader 9. A plate spring portion 13 is formed in each of the four edge portions of the pressing plate 12. The four plate spring portions 13 are screwed at tip end portions to supporting portions 14 disposed on the printed circuit board 7, via screw holes 15. The plate spring portions 13 are fixed in an elastically deformed state to the printed circuit board 7. The pressing plate 12 is caused to elastically press the heat spreader 9, by the plate spring mechanism of the pressing plate 12, and the other side face of the heat spreader 9 is closely contacted with the semiconductor package 8 on the printed circuit board 7. The pressing plate 12 presses the heat pipe 11 and the heat spreader 9, so that heat transfer efficiency is enhanced.

The heat exchanging portion 16 is disposed in the other end portion of the heat pipe 11. The heat exchanging portion 16 has a plurality of fins 17 which are stacked at intervals of about several millimeters. The other end portion of the heat pipe 11 is passed through holes which are formed in the fins 17. The heat exchanging portion 16 is accommodated in a case 18. The side of the case 18 which is on the side of the case 2 is opened, and the opening portion 19 is opposed to an air discharge port 21 formed in a side face portion 20 of the case.

An air gap where the plural fins 17 are not placed is disposed so as to oppose the heat exchanging portion 16. The fan unit 22 is placed in the case 2 while forming the air gap. The fan unit 22 is a cooling module which produces cooling air by means of rotational driving of the fan. The fan unit 22 accommodates the fan 23 which is supported so that the rotation shaft is oriented in the vertical direction. When the fan 23 is rotated, the fan unit 22 suctions the air in the vertical direction, and discharges the sucked air in the centrifugal direction of the rotation. A fan case 24 is configured by a bottom plate, a top plate, and side walls, and the plates and the side walls form a blowing air passage which guides the cooling air to end edges of the fins 17 along the side of the outer peripheral portion of the fan 23. The fan case 24 is opposed to the end edges of the fins 17 across a gap. The fan unit 22 is located upstream of the cooling air, the heat exchanging portion 16 is located downstream of the cooling air, and air flows through the vicinity 25 of the discharging port of the fan unit 22. The opening of the discharging port has a substantially rectangular shape having a long edge which is approximately equal to the total length of the heat exchanging portion 16 along the arrangement direction of the fins 17. The gap between two adjacent fins 17 functions as a flow path of the cooling air. One end edges of the fins 17 function as an air inlet, and the other end edges function as an air outlet.

According to the configuration, the cooling air is guided along the inner wall, bottom, and ceiling faces of the fan case 24, and flows through the gaps between the fins 17 through the outlet. During a process in which the cooling air passes through the gaps, heat exchange is performed between the cooling air and the fins 17, and the cooling air receives heat. The heat of the semiconductor package 8 which has been transferred from the one end portion of the heat pipe 11 to the other end portion through the heat spreader 9 is discharged from the heat exchanging portion 16 to the outside of the case 2 through the air discharge port 21.

Because of rotation of the centrifugal fan 23, dusts receives a centrifugal force to be conveyed in the air blowing route which is formed in the fan case 24, and hence dusts collect in the outlet along the inner wall of the fan case 24. In the case where the fan 23 of the fan unit 22 is rotated in a counterclockwise direction in a plan view, dusts are biased to one outer side of the end face of the outlet of the fan case 24, i.e., the edge side which is close to the hinge portions 6. Dusts are prone to accumulate in end edges of plural fins 17 which are located in the right side as viewed from the fan unit 22 to the fins 17. The reference numeral 26 in FIG. 1 indicates the place where dusts easily accumulate. Since the cooling air is guided in the blowing air passage in the centrifugal direction of the rotation, the speed of the air flow flowing through the outside of the end face of the outlet on the end face is higher than that of the air flow flowing through the inside on the end face. The existence probability of dusts in the outside of the end face of the outlet on the end face is high. In the basal end side (the front side in FIG. 1) in the arrangement direction of the fins 17 and the tip end side (the rear side in FIG. 1) in the arrangement direction, dusts begin to accumulate with starting from the side of the end edges of the fins 17 which are located in the tip end side in the arrangement direction. The dust removing mechanism 27 removes dusts which tends to adhere to the portion 26.

Figure 3:
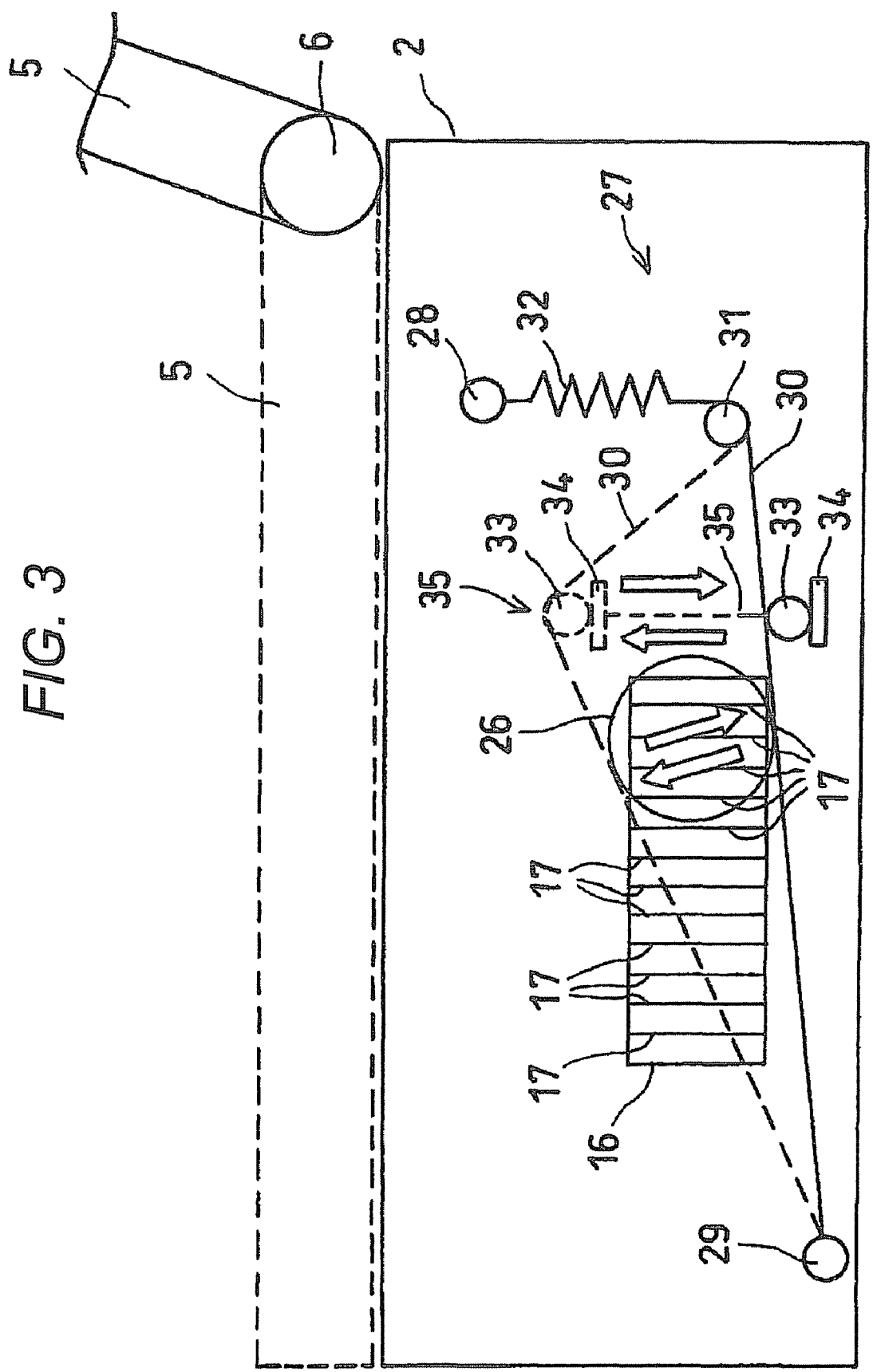
FIG. 3 is a diagram of a dust removing mechanism of the cooling device of the first embodiment of the invention.

FIG. 3 is a diagram of the dust removing mechanism 27, as viewed from the fan unit 22 to the heat exchanging portion 16. Among the reference numerals shown in FIG. 3, those which are the same as the above-described reference numerals denote the identical components. In the fins 17, many thin plates vertically upstand in parallel, and hence the fins exhibit a generally comb-like appearance. The dust removing mechanism 27 includes: a first fixing portion 28 which is disposed on the tip end side (the right side of FIG. 3) of the arrangement direction of the fins 17 in a plane including the end edges of the fins 17; a second fixing portion 29 which is disposed on the basal end side (the left side of the figure) of the arrangement direction in the same plane; a wire 30 one end of which is fixed to the first fixing portion 28, and the other end of which is fixed to the second fixing portion 29; and a first roller 31 which is disposed on the tip end side of the arrangement direction in the same plane, and around which the wire 30 is wound.

The first fixing portion 28 is a member for fixing the wire, and, for example, formed integrally with the case 2, or attached to a projected portion on the upper wall face of the case 2, or to a boss portion disposed on the side wall face of the case 2. Also the second fixing portion 29 is a member for fixing the wire, and, for example, secured to the case 2 or the printed circuit board 7. A portion of the wire 30 on the side of the first fixing portion 28 is spirally wound to be formed into a spring portion 32. The wire 30 is a metal wire, or alternatively may be a piano wire or made of another material such as glass fibers. The wire 30 may also be made of other materials such as rubber. The first roller 31 is a member around which the wire 30 is wound allowing the wire 30 to travel, and which applies a tension to the wound wire 30. A rod-like roller member having a rotation axis which is perpendicular to the plane including the end edges of the fins 17 is used as the first roller 31. Alternatively, a pulley having a rotation axis which is perpendicular to the plane may be used as the first roller 31.

The dust removing mechanism 27 further includes: a second roller 33 which is disposed on the left side of the first roller 31 in the plane including the end edges of the fins 17, and which is movable between two vertically separated positions; and a plate member 34 which supports the second roller 33, and which vertically moves the second roller 33 between the upper and lower positions. A rod-like roller member or a pulley is used as the second roller 33. The plate member 34 is attached to a lower portion of the second roller 33. Also a lifting or sliding mechanism which is not shown, and which lifts and lowers or vertically slides the plate member 34 is disposed in the case 2. For example, a small motor, or a power transmission mechanism such as a slider, a slider receiving member, and the like is used as the lifting or sliding mechanism. The lifting or sliding mechanism, the plate member 34, and the second roller 33 constitute a wire driving mechanism. Also controller (not shown) configured by a processor, a RON, a RAM, and the like is disposed. The controller controls driving of the wire 30 performed by the wire driving mechanism.

In the cooling device of the embodiment, the second roller 33 is made movable by the driving mechanism, with respect to the end edges of the fins 17 between the upper and lower positions in the plane including the end edges. The wire 30 is contacted with the outer circumferential face of the second roller 33. The outer circumferential face applies an urging force which is opposed to an elastic force due to deformation of the spring portion 32 and the tension of the wire 30, to a middle portion 35 of the wire 30 which exists between the second fixing portion 29 and the first roller 31. In a state where the middle portion 35 of the wire 30 functions as a point of force and the other end of the wire 30 functions as a fulcrum, when the middle portion 35 is pushed up, an intermediate portion of the wire 30 is caused to scrape off dusts adhering to the end edge side of the fins 17. Namely, the wire 30 which is a member for removing dusts is disposed on the surface or in the vicinity of the heat exchanging portion 16, and the intermediate portion of the wire 30 acts on the end edges, whereby dusts are removed.

Figure 4:
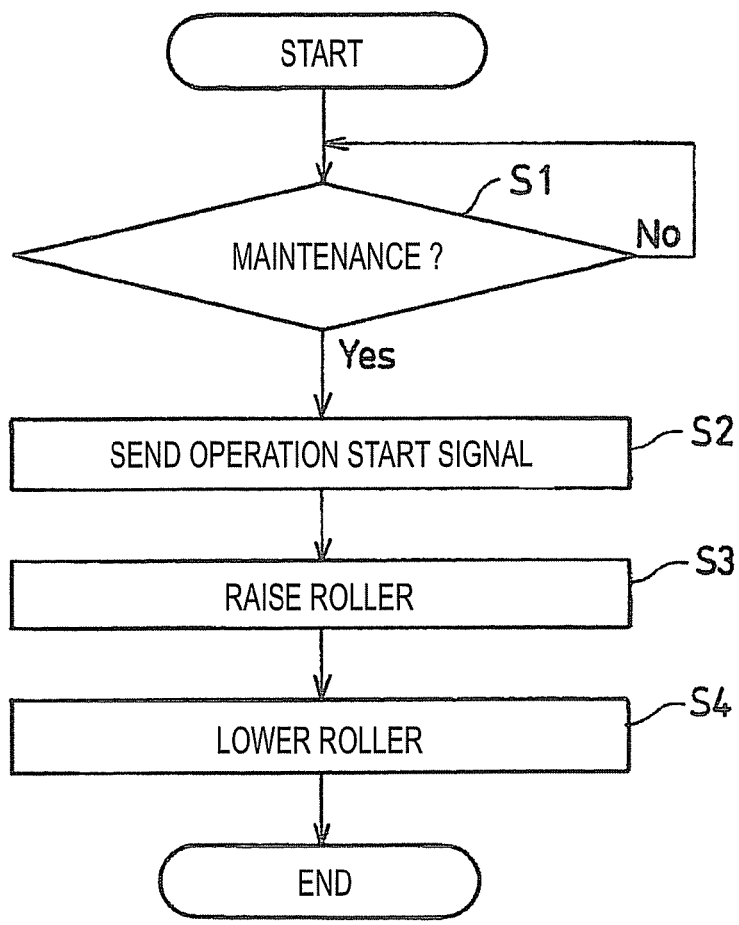
FIG. 4 is a flowchart illustrating operation timings of the dust removing mechanism of the cooling device of the first embodiment of the invention.

In the thus configured cooling device of the embodiment, when the controller sends a signal instructing the driving mechanism to start the operation, the dust removing mechanism 27 begins to operate. FIG. 4 is a flowchart illustrating operation timings of the dust removing mechanism 27 of the cooling device of the embodiment. It is assumed that the plate member 34 is initially located in the lower side. In step S1, the controller continues to monitor whether the power supply of the computer body is turned on or not, whether an operation button or the like which is not shown is pressed by the user or not, or whether the status of the electronic apparatus is set to a status for maintenance or not ("No" route).

If the controller detects in step S1 that the power supply of the computer body is turned on, that the operation button or the like is pressed, or that the status of the electronic apparatus is in the status for maintenance, the control passes through "Yes" route, and, in step S2, the controller sends an operation start signal to the lifting mechanism or the sliding mechanism. In step S3, the plate member 34 is driven by the driving mechanism to start the upward movement in the state where the wire 30 is wound therearound. During the period when the plate member 34 is upward moved, the spring portion 32 is gradually extended. The restoring force and tension due to the spring portion 32 are rightward applied to the middle portion 35 of the wire 30, and a tension is leftward applied thereto. In the state where the other end of the wire 30 functions as a fulcrum and the middle portion 35 functions as a point of force, the middle portion 35 is pushed up, and, in conjunction with this upward movement, the intermediate portion of the wire 30 rubs the end edge side of the fins 17 to scrape dusts.

After the plate member 34 is raised to the stroke end of the lifting mechanism or the sliding mechanism, the plate member 34 stops. In step S4, the plate member 34 is driven to start the downward movement. During the period when the plate member 34 is downward moved, in accordance with contracting deformation of the spring portion 32, the restoring force which is applied to the middle portion 35 from the right side is gradually reduced. In the state where the other end of the wire 30 functions as a fulcrum and the middle portion 35 of the wire functions as a point of force, the middle portion 35 is pushed down, and the intermediate portion of the wire 30 acts on the end edges, so that the wire 30 scrapes dusts adhering to the end edges of the fins 17. Since the intermediate portion of the wire 30 is vertically reciprocally driven in this way, the wire 30 sweeps the end edges of the fins 17, and dusts adhering or accumulating thereon are swept away. In the plane including the end edges of the fins 17, therefore, dusts adhering to a generally triangular region surrounded by the line connecting the fulcrum and the point of force, that connecting the lower ends of the end edges of the fins 17, and the end edge of the fin 17 situated at the right end are removed. In other words, the place where dusts from the discharging port accumulate is located in a region the wire 30 is displaceable at the largest degree.

In the cooling device of the embodiment, as described above, the dust removing mechanism 27 which is the wire driving mean moves the thin wire upward and downward, thereby causing the thin wire to slide over the end edges of the fins 17 which constitute the cooling module, so that dust adhering thereto can be scraped off.

In the cooling device of the embodiment, when the press-down force applied on the wire 30 is to be unloaded, the plate member 34 which presses down the wire 30 by the restoring force of the tension spring attached to one end side of the wire 30 may be rapidly lowered or raised, so that the plate member 34 bumps against the lower or upper stroke end. According to the configuration, the movement acceleration of the wire 30 is suddenly changed by the bump, and hence dusts can be dropped.

In the electronic apparatus having the cooling device of the embodiment, dusts in the generally triangular removal region are removed by the dust removing mechanism 27, and therefore clogging due to dusts is prevented from occurring in the heat exchanging portion 16. Since clogging does not occur, the efficiency of the heat exchange by the cooling air which uses the gaps of the adjacent fins 17 as the cooling air passage is prevented from being lowered. When the fan 23 is rotated, discharging of hot air is not impeded by dusts between the fins 17, and a phenomenon that high temperature air is confined in the case 2 hardly occurs.

The movement stroke of the plate member 34 is smaller than the thickness of the case 2. If it is assumed that the dust removing mechanism is configured by a wire member, two fixing members which fix the both ends of the wire member so that the wire member is horizontally stretched in a plane, and means for vertically driving the fixing members, means for respectively vertically driving the two fixing members are separately disposed in two places. In the dust removing mechanism, alternatively, means for vertically driving one of the two fixing members, and a coupling member which couples the two fixing members with each other must be disposed. In the case where the configuration in which means for respectively driving the two fixing members are separately disposed, or that in which one of the fixing members is driven and the other is vertically moved through the coupling member is employed, the size of the device is increased. In the cooling device of the embodiment, the stroke amount by which the second roller 33 and the plate member 34 are displaced is made smaller than the thickness of the case 2, and hence the mechanism for removing dusts can be mounted in the case 2 having a reduced thickness.

In the case 2, places for accommodating components such as a power supply unit, a medium driving device, and a storage device must be ensured, and a space for disposing other components is very limited. In the electronic apparatus having the cooling device of the embodiment, the dust removing mechanism 27 can be disposed in the narrow space between the heat exchanging portion 16 and the fan unit 22. The electronic apparatus is configured so that, except the period when the dust removing mechanism 27 operates, the wire 30 is positioned in the lower side of the case 2, and hence the components constituting the dust removing mechanism 27 do not block the cooling air passage. The dust removing mechanism 27 can be disposed in the narrow space without producing a pressure drop in the passage. The heat exchanging portion 16 can be cleaned without reducing the flow amount of air which is required for maintaining the cooling efficiency.

In a configuration where a rod-like member in a vertical state or a thin wire which is vertically stretched is disposed as a dust removing member, and a mechanism which moves the member in the fin arrangement direction along the end edges of the fins 17 is disposed in the case 2, for example, a space sufficient for the stroke amount of the driving of the member along the total length direction of the heat exchanging portion 16 must be ensured in the case 2. In order to ensure the space without blocking the cooling air passage, it is necessary to dispose base portions which can support the member, respectively in two places separated along the total length direction, or the tip end side of the heat exchanging portion 16 outside the case, and the basal end side outside the case. Because the space is restricted, the disposition of such base portions is disadvantageous. Also in a configuration where a rod-like member in a horizontal state or a thin wire which is horizontally stretched is disposed, and a mechanism which vertically moves the member of the thin wire along the end edges of the fins 17 is disposed in the case 2, columnar members which support the member or the thin wire must be disposed in two places. Because of the space restriction, also the disposition of such columnar members in the case 2 is disadvantageous.

In the case where the centrifugal fan 23 is used, dusts accumulate on the right side of the heat exchanging portion 16 in FIG. 3 because of the configuration of the fan unit 22 and the positional relationship between the fan unit 22 and the heat exchanging portion 16. It can be the that the dust removing mechanism 27 supports one point of the wire 30 as a rotation fulcrum, and removes dusts in the triangular region on the plane by means of the single point drive. In the fins 17, dusts do not or hardly adhere to the fins 17 in the left side, but adhere to those in the right side. When the dust removing mechanism 27 performs the single point drive in a state where one end of the wire 30 is fixed and the other end is movable, the area of the scraped region can be made large. When the method based on the single point drive is compared with that where the rod-like member or thin wire for removing dusts is driven horizontally or vertically in the state where two places or the both ends of the member or the thin wire are supported, the dust removing mechanism 27 can efficiently clean a place where dusts easily accumulate.

In place of the configuration where the whole area of the plane including the end edges to be cleaned is covered by moving the rod-like member or thin wire in a state where the two or both ends are supported, the dust removing mechanism 27 moves the wire 30 in the plane of the region where dusts tends to adhere. In a notebook personal computer, there is a limitation in thickness. In order to more efficiently remove dusts from a dusted portion, it may be contemplated that one of the two methods, i.e., the method where cleaning is performed while two end points of the member are supported, and that where cleaning is performed by using the single point drive is employed. In the case where the amount of adhering dusts is varied depending on the location, when the dust removing mechanism 27 uses the single point drive, only a portion where cleaning is required can be efficiently cleaned. In the cooling device and electronic apparatus of the embodiment, dusts can be removed by the simple mechanism without blocking the cooling air passage in the narrow space between the heat exchanging portion 16 and the fan unit 22.

Figure 5:
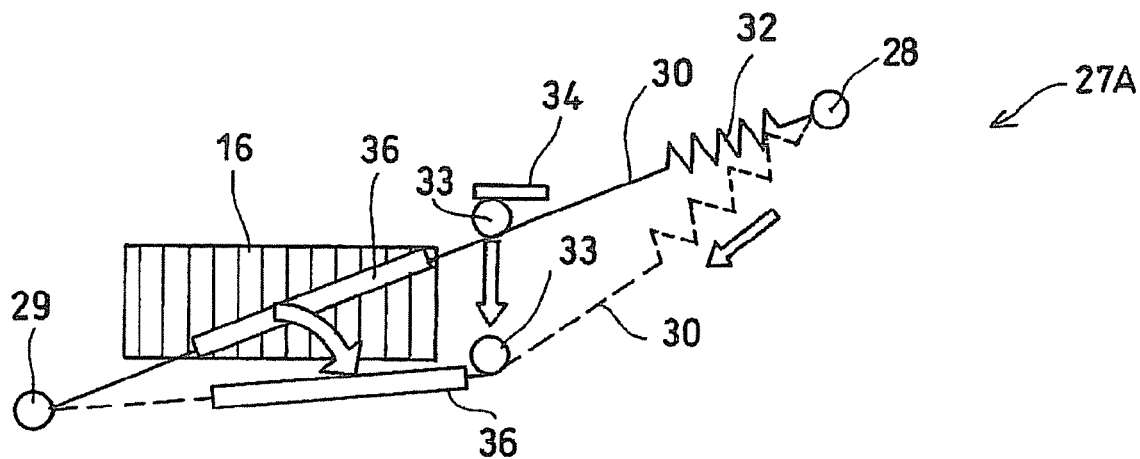
FIG. 5 is a diagram of the dust removing mechanism in the case where an intermediate portion of a wire is formed into a brush-like shape.

In the cooling device of the embodiment, the thin wire is used. Alternatively, the cooling device may use a brush-like member as the member for removing dusts. FIG. 5 is a diagram of the dust removing mechanism in the case where the intermediate portion of the wire 30 is formed into a brush-like shape. In the figure, the same reference numerals denote components which are identical with those above-described. The dust removing mechanism 27A has a brush-like portion 36 which uses the wire 30 as a core member, and which is configured by bristle members embedded in an outer circumferential portion of the core member. Namely, the dust removing mechanism 27A has a configuration including a wire and a brush. A material which easily adsorbs dusts is used in the bristle members. A scrub brush-like member may be used in the brush-like portion 36. According to the configuration, the brush-like portion 36 is moved so as to slide over or sweep the edge ends of the fins 17, and dusts are swept away. Alternatively, a member having a thin plate-like portion may be used as the intermediate portion of the wire 30. In the alternative, in the state where the member is horizontal, thin plate-like portion scrapes or strip off dusts.

Figure 6:
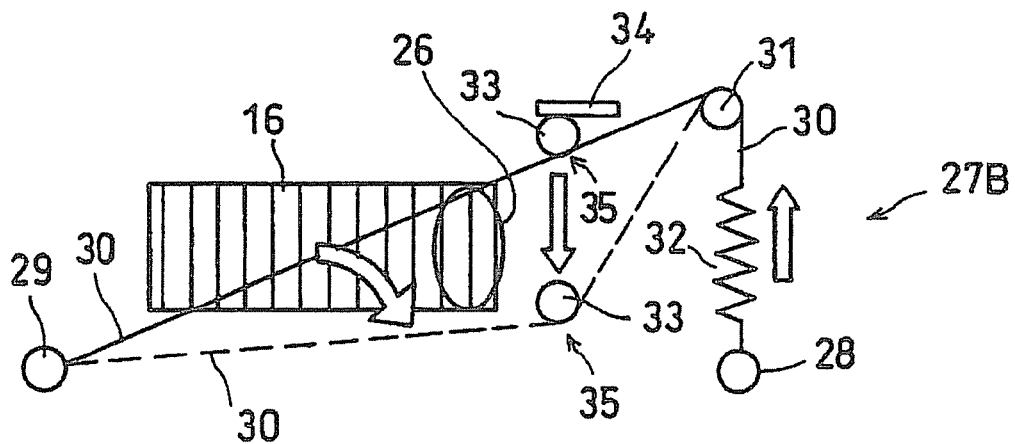
FIG. 6 is a diagram of a dust removing mechanism having a configuration where a first fixing portion and driving mechanism are arranged in a manner different from those of the example of FIG. 3.

In the dust removing mechanisms 27, 27A, the position of the first fixing portion 28 which engagingly holds the wire 30 may be changed as shown in, for example, FIG. 6. FIG. 6 is a diagram of a dust removing mechanism having a configuration where the first fixing portion 28 and the driving mechanism are arranged in a manner different from those of the example of FIG. 3. The components denoted by the same reference numerals as those described above are identical with the components which are denoted by the reference numerals in the above. The first fixing portion 28 is placed in the right side as viewed from the fan unit 22 to the end edges of the fins 17, and in the lower portion of the interior of the case 2, and the first roller 31 is placed above the first fixing portion 28 in the plane including the end edges. The dust removing mechanism 27B includes the first fixing portion 28, the second fixing portion 29, the wire 30, the first roller 31, the second roller 33, the plate member 34 attached to an upper portion of the second roller 33, and a lifting or sliding mechanism which is not shown, and which lifts and lowers the plate member 34 between upper and lower positions. Also the dust removing mechanism 27B has the configuration where the second fixing portion 29 functions as a fulcrum, the second roller 33 functions as a point of force, and the intermediate portion of the wire 30 functions as a point of action.

According to the configuration, the second roller 33 applies an urging force to the middle portion 35 of the wire 30. In a state where the middle portion 35 functions as a point of force and the other end of the wire 30 functions as a fulcrum, when the middle portion 35 is pushed down, the intermediate portion of the wire 30 is caused to scrape off dusts adhering to the end edge side of the fins 17. When the urging force is released, the wire 30 returns to its original state. Dusts adhering to a generally triangular region including the end edges are removed.

Figure 7A:
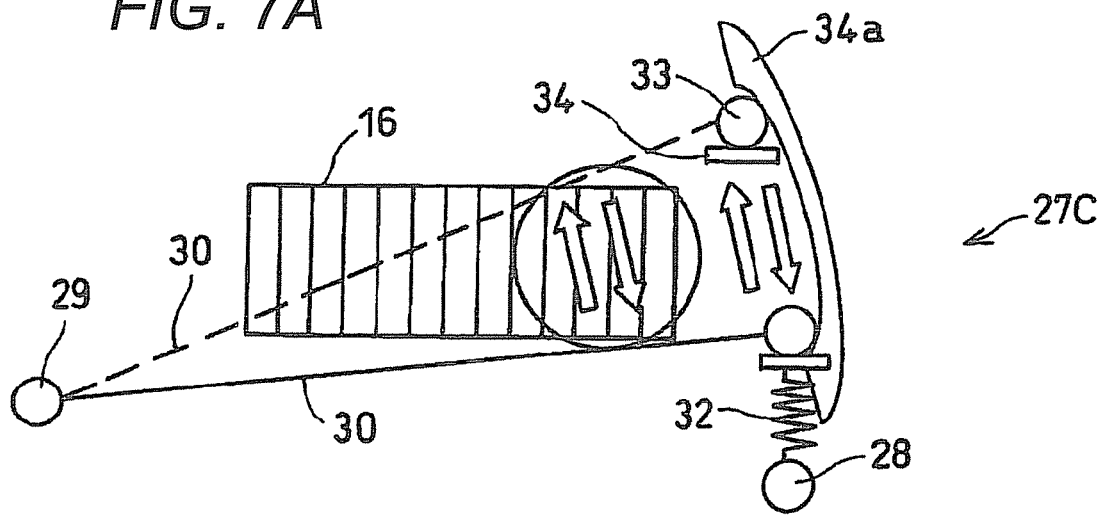
FIG. 7A is a diagram of a cooling device having a dust removing mechanism in which a paddle-like thin plate is disposed as a guiding member.
Figure 7B:
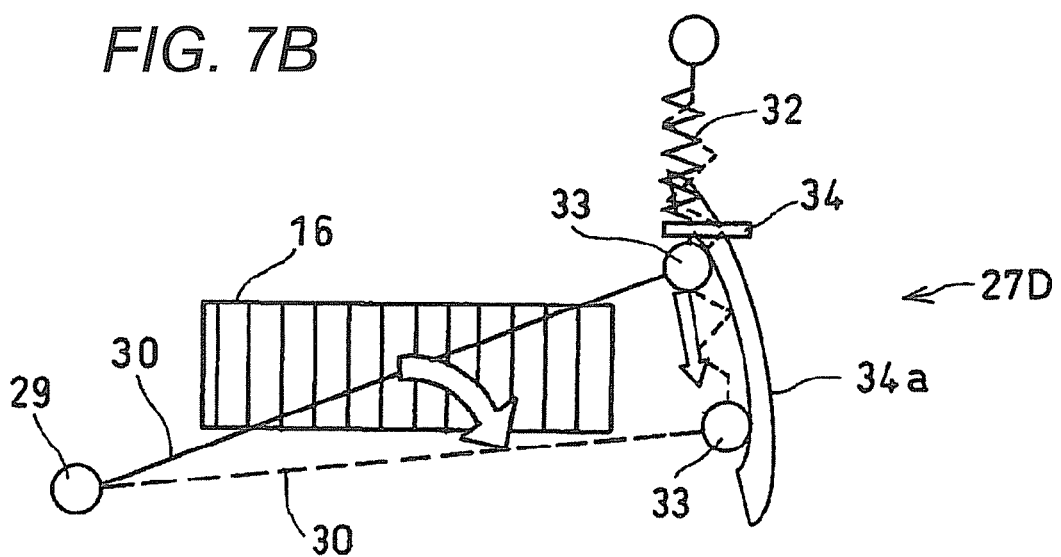
FIG. 7B is a diagram of a cooling device having a dust removing mechanism.

The dust removing mechanisms 27, 27A, 27B are configured so that the plate member 34 is vertically displaced. The cooling device of the embodiment may be configured so that a guiding member which guides the movement of the plate member 34 is disposed. FIG. 7A is a diagram of a cooling device having a dust removing mechanism 27C in which a paddle-like thin plate is disposed as the guiding member, and FIG. 7B is a diagram of a cooling device having a dust removing mechanism 27D. In FIGS. 7A and 7B, the position of the spring portion 32 is adequately changed. The guiding member 34a is molded into a template-like shape. The outer shape of the guiding member 34a has an arcuate curved portion when viewed toward the end face of the fins 17, and is formed into a shape in which the distance between the fulcrum and the point of force is maintained substantially constant irrespective of the position of the second roller 33. The second roller 33 is travelable along the outer shape of the guiding member 34a.

When the driving mechanism of the thus configured dust removing mechanism 27C upward moves the plate member 34, the second roller 33 is guided along the outer shape of the guiding member 34a, and the wire 30 is upward moved by pushing up the wire 30 by the second roller 33, or by releasing the elastic force stored in the spring portion 32. In conjunction with the movement of the wire 30, the intermediate portion of the wire 30 scrapes dusts adhering to the end edges. When the plate member 34 is downward moved, the wire 30 is downward moved by pushing down the wire 30 by the second roller 33, or the restoring force of the spring portion 32. Therefore, dusts adhering to the end edges are scraped off. The dust removing mechanism 27D operates in a similar manner as the dust removing mechanism 27C.

Since the arcuate guiding member 34a is used as described above, the wire 30 is moved while the distance between the second roller 33 and the swing center of the wire 30 which is located in the second fixing portion 29 is kept constant. In place of the wire 30, or together with the wire 30, a brush-like member or a thin plate may be used as the member for removing dust. In the case where the mechanism is configured so that the movement locus of the second roller 33 is moved in the stretch direction of the wire 30, for example, a guiding member having a linear outer shape is used. According to the cooling device and electronic apparatus of the modification, since a thin plate is used, the dust removal can be performed without impeding the air flow.

First Modification of the First Embodiment

Figure 8A:
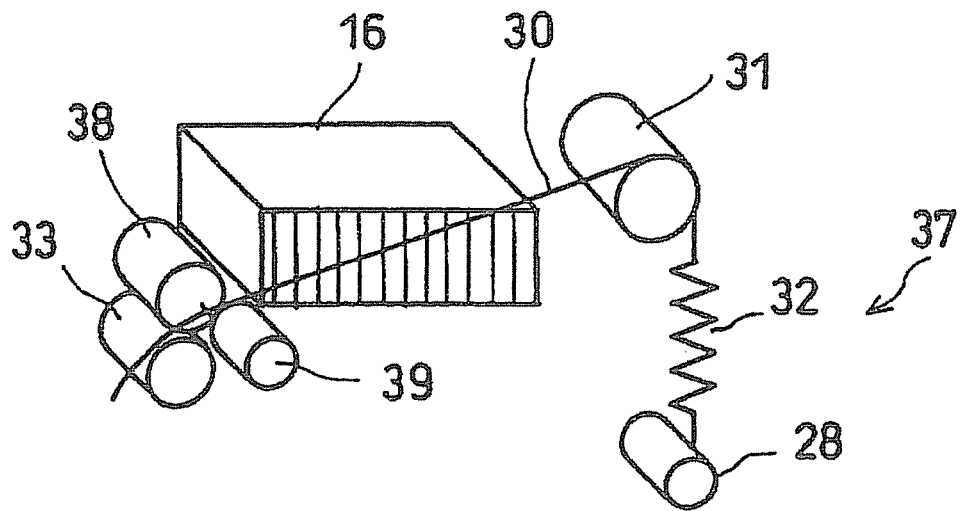
FIG. 8A is a perspective view of main portions of a dust removing mechanism of a cooling device of a first modification of the first embodiment of the invention.
Figure 8B:
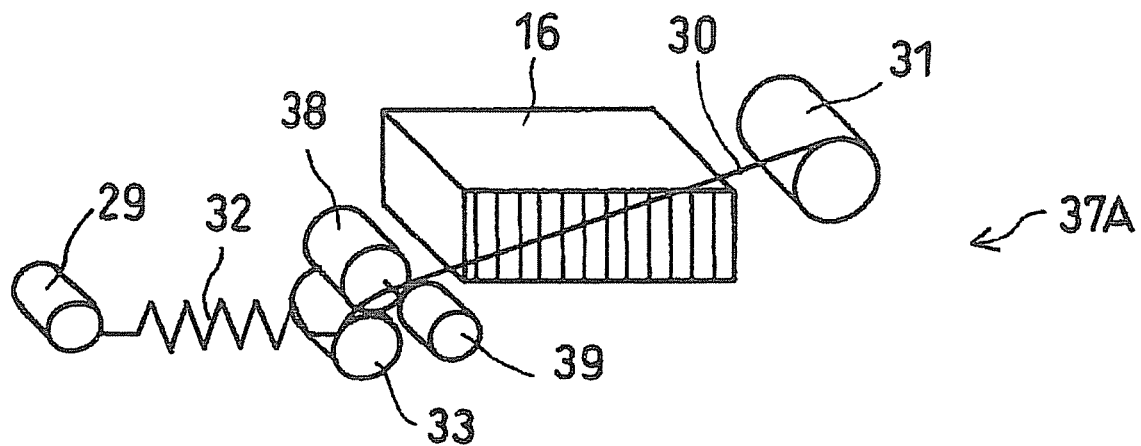
FIG. 8B is a perspective view of main portions of another configuration of the dust removing mechanism of the cooling device of the first modification of the first embodiment of the invention.

When the wire 30 scrapes off dusts in a state where the wire 30 is contacted with the fins 17, vibrations may be applied to the wire 30. In a cooling device of a first modification of the first embodiment of the invention, vibrator for applying vibrations to the wire 30 is disposed. FIGS. 8A and 8B show examples of the vibrator. FIG. 8A is a perspective view of main portions of the dust removing mechanism of the cooling device of the first modification of the first embodiment of the invention. Among the reference numerals shown in FIG. 8, those which are the same as the above-described reference numerals denote the identical components. The dust removing mechanism 37 includes: an eccentric weight 38 which is coupled to the wire 30 in an operable state; and a motor 39 which is coupled to the eccentric weight 38 to rotate the eccentric weight 38, thereby vibrating the wire 30. The eccentric weight 38 and the motor 39 constitute the vibrator.

When the user presses an operation button or the like which is not shown, and which is attached to the case 2 accommodating the thus configured cooling device of the modification, the controller outputs the operation start signal. When the driving mechanism receives the operation start signal, the second roller 33 is moved upward or downward. The controller outputs the operation start signal, and sends to the motor 39 a signal instructing the start of a vibrating operation. When the motor 39 drives the eccentric weight 38 so that the eccentric weight 38 is eccentrically rotated, the wire 30 is irregularly vibrated in vertical and lateral directions. Since vibrations are applied to the wire 30 in the state where the wire 30 is moved, dusts are shaken off the fins 17.

Immediately after the fins 17 are cleaned, dusts do not stick to the fins 17, and, in an initial stage of dust accumulation, the amount of adhering dusts is very small. According to the cooling device of the modification, in the case where a small amount of dusts adheres to the fins 17, the dusts can be easily removed. The vibrator may include a claw-like member. When the claw-like member scratches the wire 30, dust can drop off the cooling device.

FIG. 8B is a perspective view of main portions of another configuration of the dust removing mechanism of the cooling device of the first modification of the first embodiment of the invention. In the dust removing mechanism 37A, the position of the spring portion 32 is different from that of FIG. 8A. When the eccentric weight 38 is rotated by the motor 38, vibrations are forcedly applied to the wire 30. Since the wire 30 is moved in the state where the wire 30 is vibrated, dusts are shaken off the fins 17.

According to the cooling device and electronic apparatus of the modification, the wire 30 is aggressively vibrated irrespective of the driving mechanism for the wire 30, and hence the performance of removing dusts is improved. When the dust removing mechanism 37 or 37A operates the wire 30, the wire 30 is vibrated, and hence the dust removing capability is enhanced.

In FIGS. 8A and 8B, a brush-like or thin plate-like member may be used as the intermediate portion of the wire 30. Also in the cooling device and electronic apparatus of the modification, dusts in the generally triangular removal region are effectively removed.

Second Modification of the First Embodiment

Figure 9A:
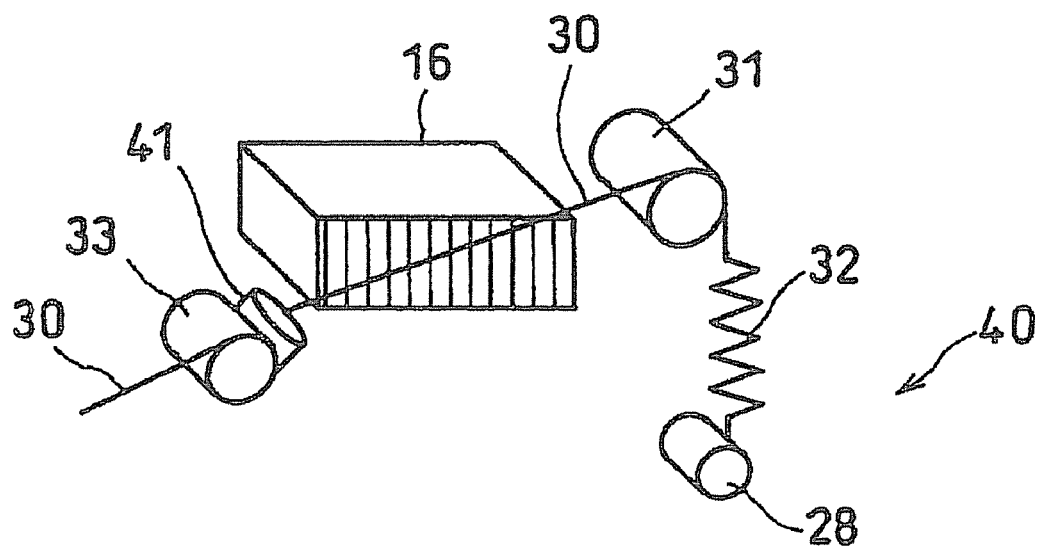
FIGS. 9A and 9B are perspective views of main portions of a dust removing mechanism of a cooling device of a second modification of the first embodiment of the invention.

The cooling device may use the wire 30 to which a vibrating element such as a piezoelectric element is attached, and voltage-drive the piezoelectric element to vibrate the wire 30. FIG. 9A is a perspective view of main portions of the dust removing mechanism of the cooling device of a second modification of the first embodiment of the invention. The dust removing mechanism 40 includes: a piezoelectric element 41 fixed to the second roller 33; and the wire 30 one end of which is wound around the first roller 31, and the other end of which is attached to the piezoelectric element 41. The wire 30 and the piezoelectric element 41 constitute the vibrator. A voltage applying circuit which is not shown is connected to the piezoelectric element 41. When a voltage is applied from the circuit to the piezoelectric element 41, the piezoelectric element 41 is deformed to bend about the fixed place, and the wire 30 is vibrated.

When the power supply of the electronic apparatus 1 having the thus configured cooling device of the modification is turned on, the controller sends an operation start signal to the driving mechanism. The controller sends a driving signal to the voltage applying circuit, and the piezoelectric element 41 is bent. The piezoelectric element 41 applies forced vibrations to the wire 30 along the longitudinal direction of the wire 30. Therefore, the wire 30 is driven in a state where the wire is vibrated, and dusts are shaken off the fins 17. The cooling device actively removes dusts.

Figure 9B:
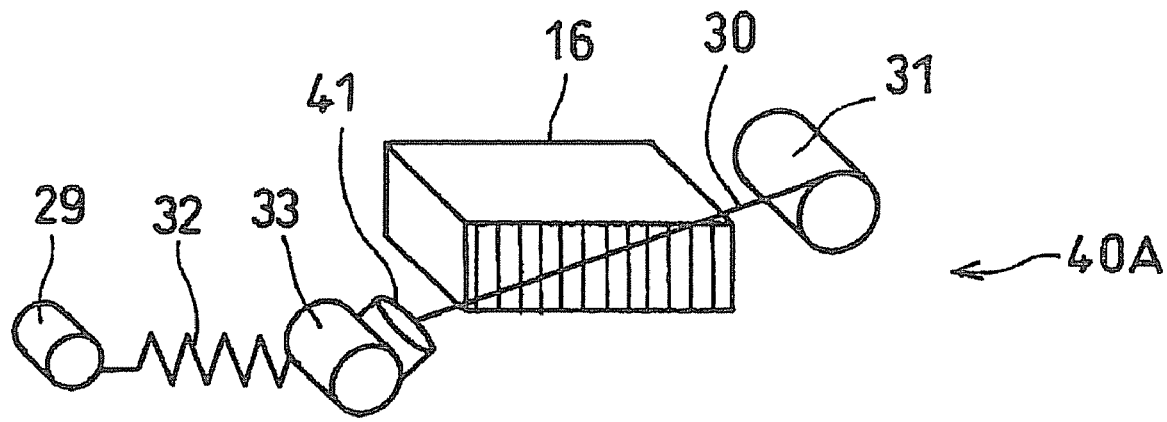

FIG. 9B is a perspective view of main portions of a second configuration of the dust removing mechanism of the cooling device of the second modification of the first embodiment of the invention. In the dust removing mechanism 40A, the spring portion which applies an urging force to the wire 30 is formed at a position which is different from the example shown in FIG. 9A.

Figure 9C:
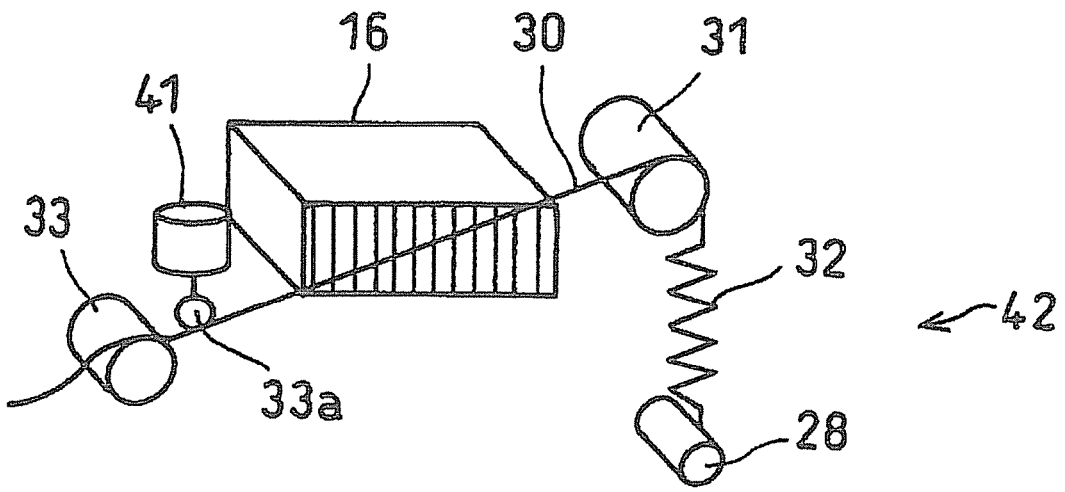
FIGS. 9C and 9D are perspective views of main portions of a second configuration of the dust removing mechanism of the cooling device of the second modification of the first embodiment of the invention.

The piezoelectric element 41 may be attached to the wire 30 in a manner of an example shown in FIG. 9B. FIG. 9C is a perspective view of main portions of a third configuration of the dust removing mechanism of the cooling device of the second modification of the first embodiment of the invention. The piezoelectric element 41 is placed so as to vibrate the wire 30 in a vibration direction having vertical components, via a pulley 33a which abuts against the wire 30. When the power supply of the electronic apparatus 1 having the thus configured vibrator 42 is turned on, a voltage is applied to the piezoelectric element 41, and the vibrator configured by the piezoelectric element 41 and the pulley 33a applies vertical vibrations to the wire 30. The wire 30 is driven in a state where the wire is vibrated, and dusts are shaken off the fins 17.

Figure 9D:
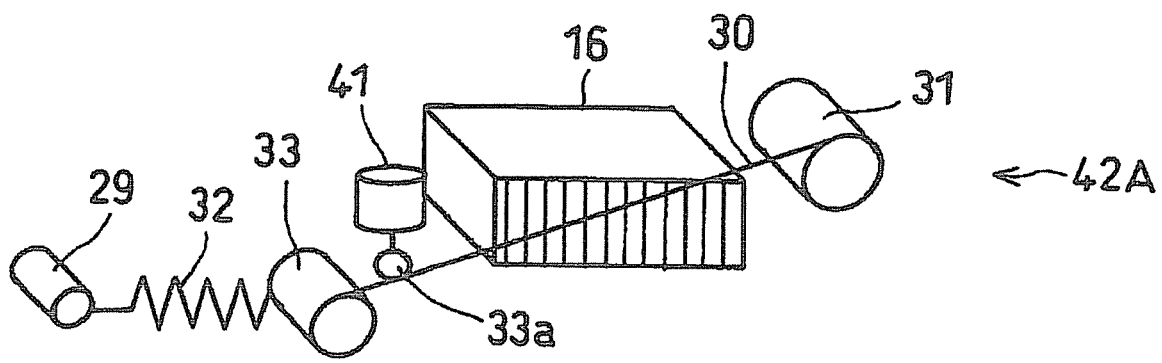

The dust removing mechanism of the cooling device of the modification may be configured as shown in FIG. 9D. FIG. 9D is a perspective view of main portions of a fourth configuration of the dust removing mechanism of the cooling device of the second modification of the first embodiment of the invention. In the dust removing mechanism 42A, the spring portion which applies an urging force to the wire 30 is formed at a position which is different from the example shown in FIG. 9C. Also in this configuration, at the turn-on of the power supply of the device, the piezoelectric element 41 is deformed to bend, and the wire 30 is vibrated while being driven, whereby dusts are removed.

According to the cooling device using the dust removing mechanism 40 or 40A, forced vibrations can be applied to the wire 30 in the stretch direction of the wire. According to the cooling device using the dust removing mechanism 42 or 42A, forced vibrations can be applied to the wire 30 in the direction of the plane intersecting the stretch direction of the wire.

Third Modification of the First Embodiment

Figure 10:
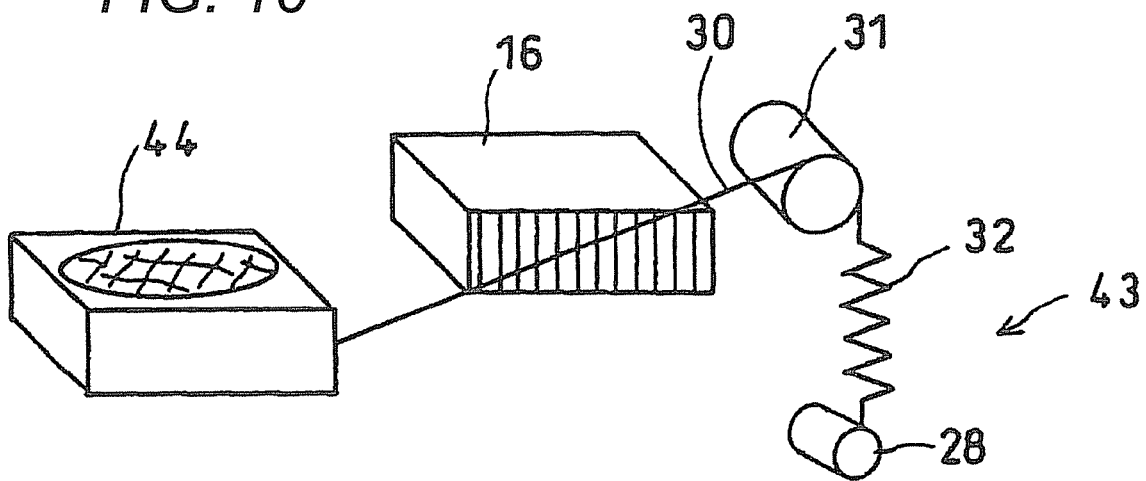
FIG. 10 is a perspective view of main portions of a dust removing mechanism of a cooling device of a third modification of the first embodiment of the invention.

The cooling device may be configured so that the wire 30 is connected to a speaker disposed in the case 2, and the wire 30 is driven in a state where the wire is vibrated by a sound wave from the speaker. FIG. 10 is a perspective view of main portions of a dust removing mechanism of a cooling device of a third modification of the first embodiment of the invention. The dust removing mechanism 43 has a speaker unit 44 attached to the case 2, and the other end of the wire 30 is bound or engaged with a hole or hook disposed in a case of the speaker unit 44. The spring constant and the material characteristics of the wire member are determined, and the tension of the wire 30 is adjusted so that the speaker unit 44 and the wire 30 vibrate at the same resonance frequency.

In the thus configured dust removing mechanism 43 of the cooling device of the modification, vibrations of the speaker mounted in the notebook personal computer are transmitted to the wire 30, whereby the wire 30 is forcedly vibrated. Therefore, the wire 30 is driven in a state where the wire is vibrated, and dusts are shaken off the fins 17.

In an electronic apparatus having the cooling device of the modification, the speaker unit 44 can be used as means for vibrating the wire 30, and, during a period when the speaker unit 44 emits a sound wave, vibrations are continued to be applied to the wire 30.

Fourth Modification of the First Embodiment

Figure 11A:
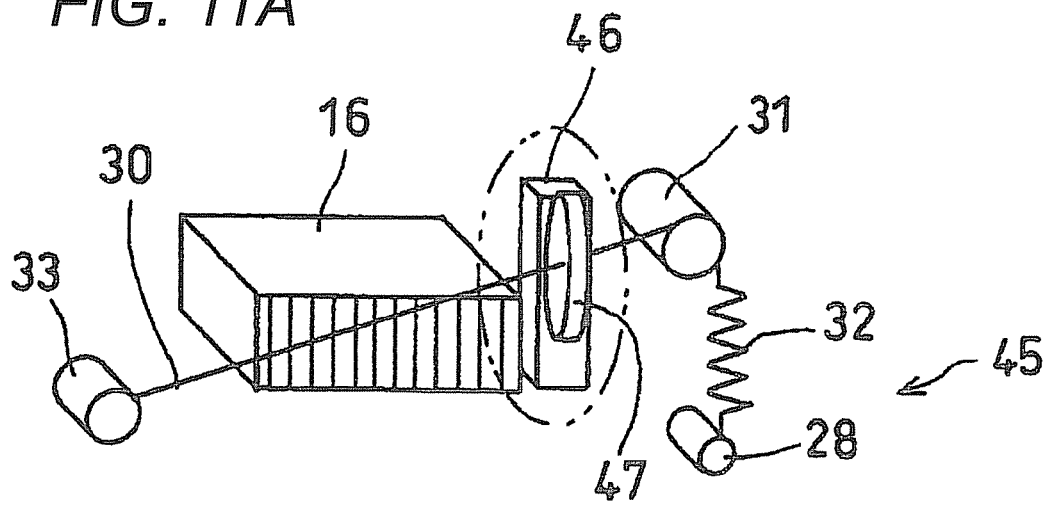
FIG. 11A is a perspective view of main portions of a dust removing mechanism of a cooling device of a fourth modification of the first embodiment of the invention.
Figure 11B:
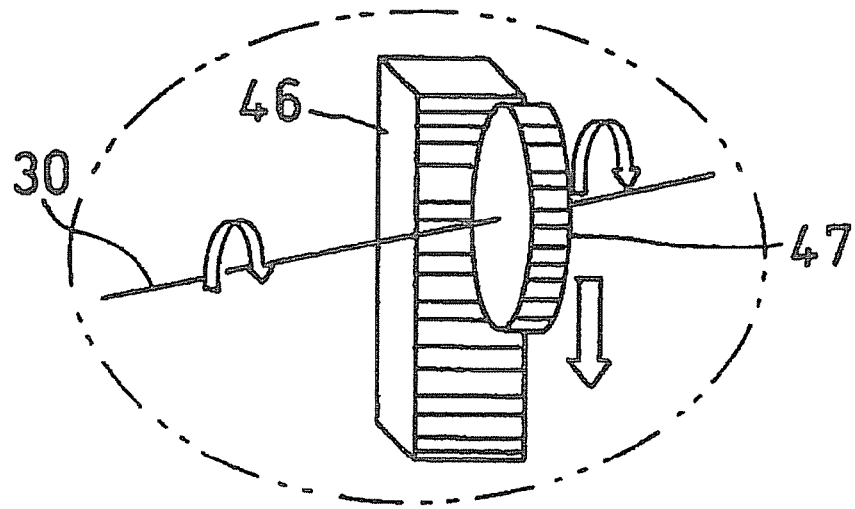
FIG. 11B is an enlarged view showing a rack gear, a pinion gear, and a wire.

The cooling device may be configured so that a mechanism having a twist driving configuration is disposed, and the wire 30 is vibrated by the mechanism. FIG. 11A is a perspective view of main portions of a dust removing mechanism of a cooling device of a fourth modification of the first embodiment of the invention. FIG. 11B is a view enlargedly showing a rack gear 46, a pinion gear 47, and the wire 30. The dust removing mechanism 45 includes: the rack gear 46 which has a side face portion positioned in the plane including the end edges of the fins 17, and in which rack teeth are formed in the vertical direction on the side face portion; the pinion gear 47 in which a pinion meshing with the rack teeth is formed in the outer circumferential face; and the wire 30 which is passed through a through hole of the pinion gear 47.

The pinion gear 47 is configured so that, when the gear rotates in one direction, the gear is caused to downward slide, and, when the gear rotates in the other direction, the gear is caused to upward slide. In the cooling device, namely, the pinion gear 47 functions as a component for pushing down the wire 30. Twisting stress is repeatedly applied to the wire 30. Therefore, a material which has strength of a certain degree, or which is not broken is used in the wire 30.

According to the configuration, when the pinion gear 47 downward slides, the pinion gear 47 is moved while the through hole twists the wire 30, and the wire 30 is pushed down. The twist driving is applied so as to scrape off dusts on the surface of the cooling module, and therefore dusts are removed. When the pinion gear 47 is moved to the lower portion of the case 2 and the driving force on the pinion gear 47 is then released, the pinion gear 47 is returned to the upper portion by the restoring force of the spring. In this case, the wire 30 is suddenly rotated in the direction in which the twist is canceled, and therefore dusts attached to the wire 30 are separated from the wire 30.

According to the cooling device and electronic apparatus of the modification, the wire 30 is displaced while being twisted, and hence dusts can be scraped off more surely.

In place of the use of the rack gear 46 and the pinion gear 47, the cooling device of the modification may include: a columnar slide guide in which concaves and convexes are formed on the side face portion in the vertical direction; and a disk in which rack teeth engaging with the concaves and the convexes are formed on the outer circumferential face, and, each time when the wire 30 is urged toward the slide guide, the wire 30 itself may be vibrated by the concaves and the convexes. According to the configuration, equivalent effects can be obtained.

Fifth Modification of the First Embodiment

Figure 12:
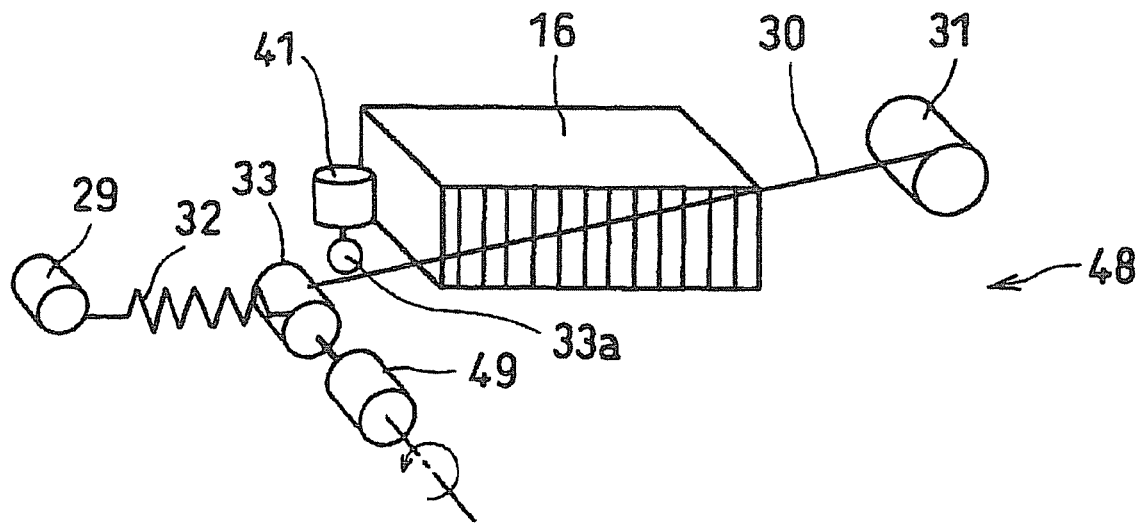
FIG. 12 is a perspective view of main portions of a dust removing mechanism of a cooling device of a fifth modification of the first embodiment of the invention.

In the dust removing mechanism, a tension adjusting mechanism which adjusts the degree of the tension of the wire 30 may be disposed. FIG. 12 is a perspective view of main portions of a dust removing mechanism of a cooling device of a fifth modification of the first embodiment of the invention. The dust removing mechanism 48 includes the tension adjusting mechanism configured by: the wire 30; the pulley 33a which abuts against the wire 30; the piezoelectric element 41 which is attached to the pulley 33a; the second roller 33; and a motor 49 in which the shaft is attached to the rotation shaft of the second roller 33. In the dust removing mechanism 48, when the shaft of the motor 49 is rotated, the wire 30 is wound up so that the tension of the wire 30 is adjusted. In the case where the thus configured dust removing mechanism 48 is driven, when the voltage is applied to the piezoelectric element 41, the piezoelectric element 41 vibrates the wire 30 in substantially vertical directions. Therefore, the wire 30 is driven in a state where the wire is vibrated, and hence dusts are shaken off the fins 17.

Figure 13:
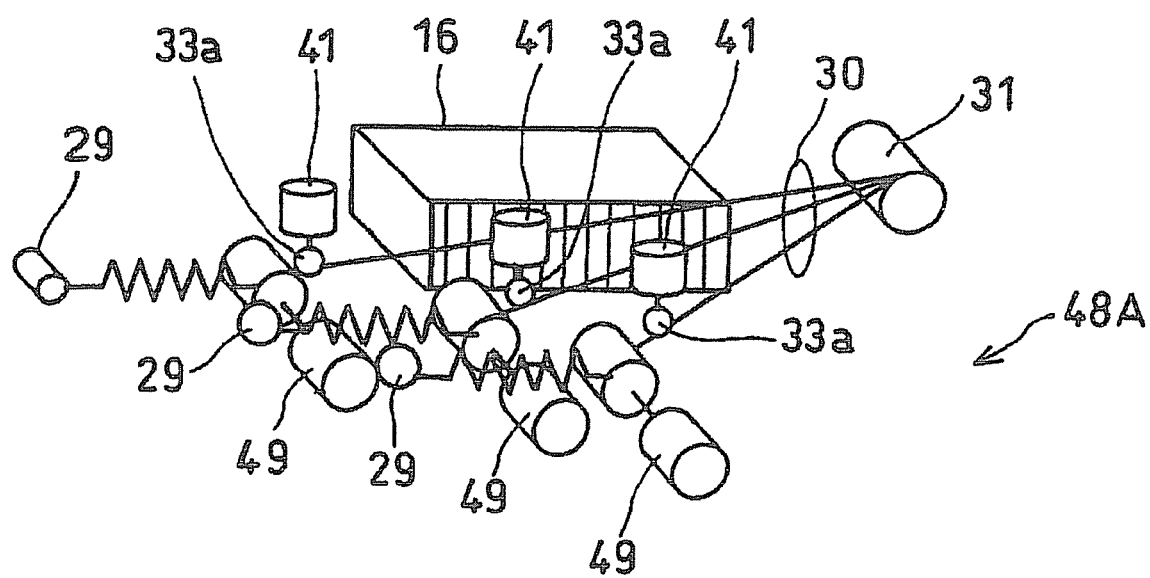
FIG. 13 is a perspective view of main portions of a dust removing mechanism in which a plurality of tension adjusting mechanisms are disposed, in the fifth modification of the first embodiment of the invention.

In the cooling device of the modification, a plurality of tension adjusting mechanisms may be disposed. FIG. 13 is a perspective view of main portions of a dust removing mechanism 48A in which a plurality of tension adjusting mechanisms are disposed. According to the configuration, in each of the tension adjusting mechanisms, the wire 30 is snapped by the pulley 33a which abuts against the wire 30, and hence dusts are shaken off.

According to the cooling device and electronic apparatus of the modification, the degree of the tension of the wire 30 is adequately adjusted, and then the wire 30 can be vibrated.

Second Embodiment

The cooling devices of the first embodiment of the invention and the modifications use the small motor or the sliding mechanism as the wire driving source for moving the wire 30. The wire driving source may be configured in a different manner. A cooling device of a second embodiment of the invention is configured so that the force which, during opening and closing operations, is applied to the hinge portions 6 that couple the case 2 and the display unit 5 with each other is transmitted as the driving force of moving the wire 30. Also an electronic apparatus having the cooling device of the embodiment is a notebook personal computer having a cooling device, and has the same cooling components as the example of the electronic apparatus 1 of the first embodiment.

Figure 14:
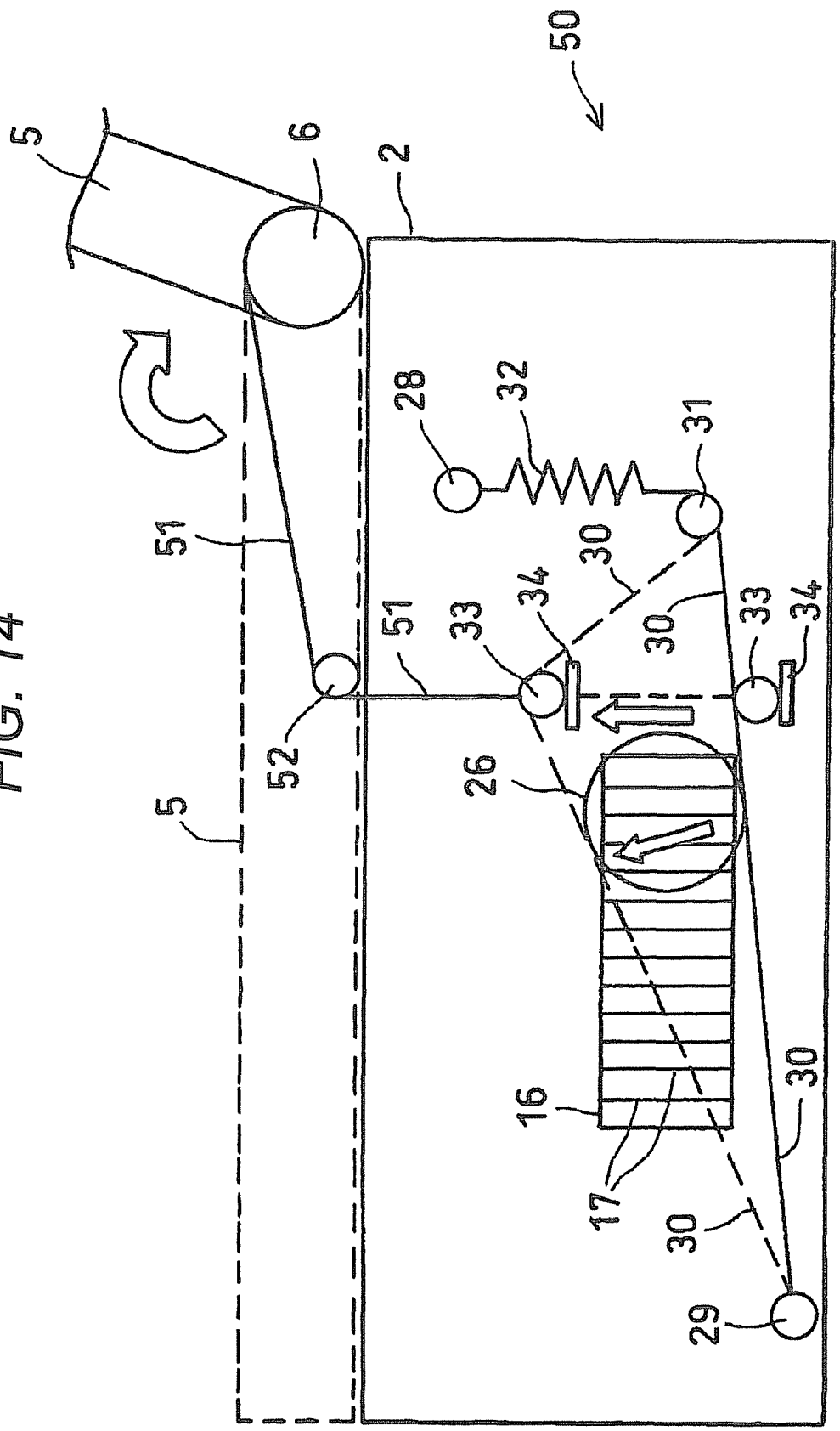
FIG. 14 is a diagram of a dust removing mechanism of an electronic apparatus having a cooling device of a second embodiment of the invention.

FIG. 14 is a diagram of a dust removing mechanism of the cooling device of the embodiment, and shows a side end view of the state where the display unit 5 is opened. The components denoted by the same reference numerals as those described above are identical with the components which are denoted by the reference numerals in the above. The dust removing mechanism 50 includes: the wire 30; the second roller 33; the plate member 34; a slide receiver which is not shown, and which holds to lift the plate member 34 or holds the plate member 34 so as to slide in vertical directions; the hinge portions 6; a wire member 51 one end of which is fixed to the outer circumferential face of one of the hinge portions 6, and the other end of which is fixed to the plate member 34; and a wound portion 52 around which the wire member 51 is wound to allow the wire member 51 to travel. The wound portion 52 is a roller or pulley having a rotation shaft which is parallel to the hinge shaft and the rotation shaft of the second roller 33, and attached to the upper wall of the case 2. The wound portion 52 transmits the rotational driving force which is applied to the hinge portion 6 during opening and closing operations, to the plate member 34 through the wire member 51, whereby the driving force of vertically moving the plate member 34 is produced.

The display unit 5 is swingable among a fully closed position where the display unit is folded so as to cover a keyboard (not shown) from the upper side, an upstanding position where the display unit upstands so as to expose the keyboard, and a fully opened position where the display unit has a fully opened posture with respect to a keyboard face. The swing angle of the display unit 5 with respect to the case 2 can be engagingly held by the hinge portions 6 at a desired angle between the fully closed position and the fully opened position.

Figure 15:
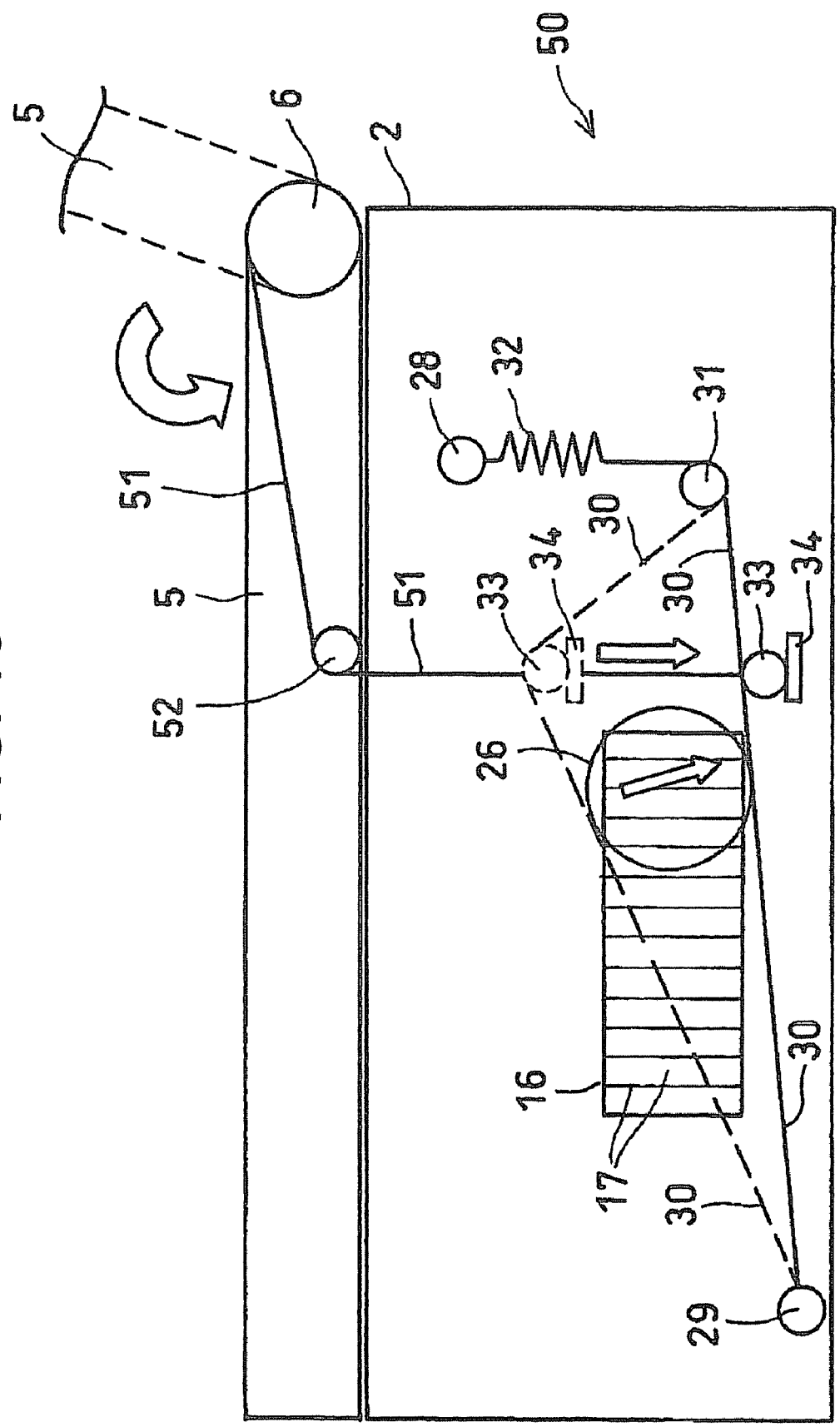
FIG. 15 is a diagram of the electronic apparatus having the cooling device of the second embodiment of the invention, showing a state where a display unit is closed.

In the electronic apparatus having the thus configured cooling device of the embodiment, when the user opens the display unit 5, the dust removing mechanism 50 pushes up the plate member 34 in conjunction with the hinge mechanism. In conjunction with this, the intermediate portion of the wire 30 swings with setting the second fixing portion 29 as a fulcrum, to scrape off dusts adhering to the end edges of the fins 17. FIG. 15 is a diagram showing the dust removing mechanism 50 in the state where the display unit 5 is closed. When the user closes the display unit 5, the dust removing mechanism 50 lowers the level of the plate member 34 in conjunction with the closing operation. In conjunction with this, the intermediate portion of the wire 30 is returned to the lower portion, and again scrapes off dusts adhering to the end edges of the fins 17. In this way, the movable member is displacement driven between the upper and lower positions in conjunction with the winding and rewinding operations of the wire member 51 due to the swing of the hinge portions 6.

In the cooling device and the electronic apparatus, vibrator which applies vibrations to the wire 30 may be disposed, and, when the wire 30 scrapes dusts in the state where the wire is contacted with the fins 17, the wire 30 may be vibrated. According to the configuration, dusts in an initial stage of dust accumulation can be easily shaken off. Dusts may be removed by using a brush-like member.

According to the cooling device of the embodiment and the electronic apparatus having the cooling device, in the plane including the end edges, dusts adhering to a generally triangular region surrounded by the line connecting the fulcrum and the point of force, that connecting the lower ends of the end edges of the fins 17, and the end edge of the fin 17 situated at the right end can be removed.

According to the cooling device of the embodiment of the invention and the electronic apparatus, the wire can scrape the end edges of the fins 17 while being reciprocated in accordance with the opening and closing operations of the hinge. The intermediate portion of the wire 30 can be vertically moved without using a small motor for displacing the position of the plate member 34. As compared with the examples where the means for driving the plate member 34 is configured by using a small motor, the space for installing components in the case 2 can be saved.

First Modification of the Second Embodiment

Figure 16:
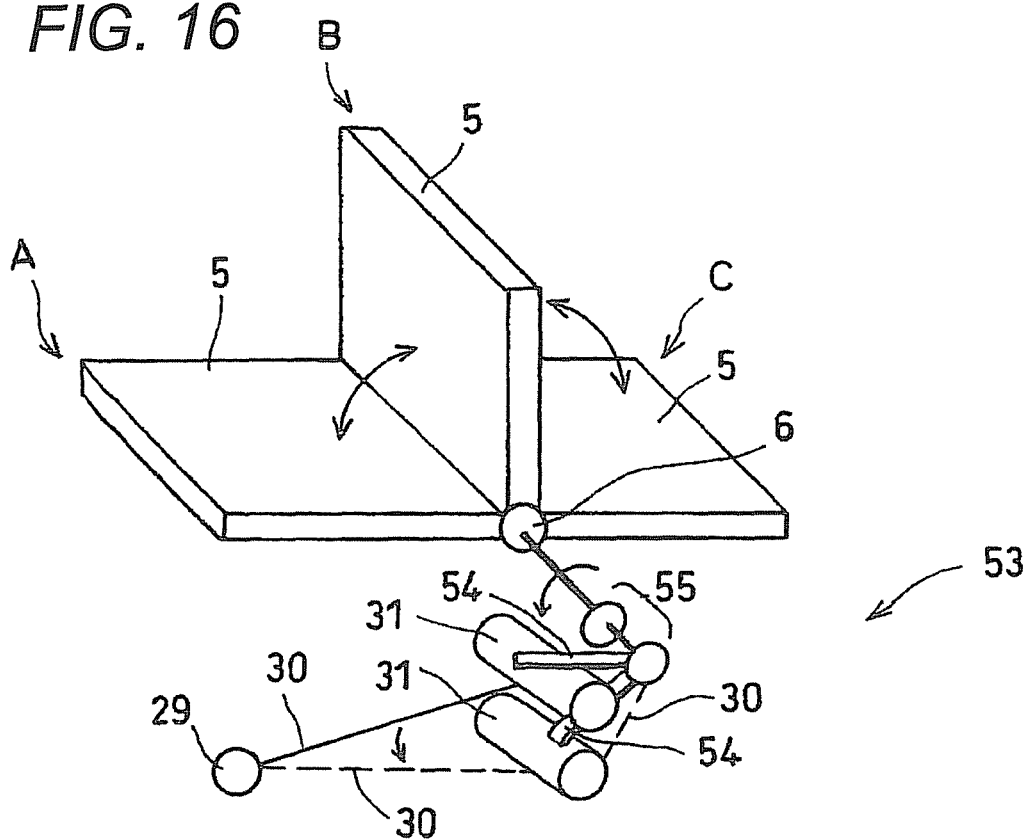
FIG. 16 is an exploded perspective view of main portions of a dust removing mechanism of a cooling device of a first modification of the second embodiment of the invention.

The cooling device may be configured by disposing a one-way clutch which transmits the driving force applied to the hinge portion 6, to the wound portion 52. FIG. 16 is an exploded perspective view of main portions of a dust removing mechanism of a cooling device of a first modification of the second embodiment of the invention. The dust removing mechanism 50 has a one-way clutch 55 having an arm portion 54 which abuts against an upper portion of the first roller 31. The one-way clutch 55 is disposed between the outer circumferential face of the hinge portion 6 and the inner circumferential face of an outer-diameter side member which is disposed in the outer-diameter side of the hinge portion 6, and, only when the outer-diameter side member is rotated in one direction with respect to the hinge portion 6, enables the rotation force to be transmitted between the hinge portion 6 and the outer-diameter side member. The one-way clutch is configured so as also to transmit the driving force between the outer circumferential face of the hinge portion 6 and the inner circumferential face of the outer-diameter side member, and cancel the transmission of the driving force.

The hinge portions 6 support the display unit 5 so as to be openable and closable in an angle range from 0 to 180 deg. with respect to the upper face of the case 2 of the computer body. FIG. 16 shows positions of the display unit 5 in three states of a state A where the display unit 5 and the case 2 are closed in a two-fold manner, a state B where the display unit 5 upstands from the case 2, and a state C where the display unit 5 is backward flattened.

In the thus configured dust removing mechanism 50, during an operation of closing the display unit 5 from the flattened state C or the upstand state B to the state A, the wire 30 is displaced from the upper side to the lower side, and the intermediate portion of the wire 30 scrapes off dusts adhering to the end edges of the fins 17 which are not shown. After the restriction of the opening direction urging force to the hinge portion 6 is canceled, during an operation of opening the display unit 5 from the state A to the state B or the state C, the wire 30 is displaced from the lower side to the upper side. Also in this case, dusts adhering to the end edges of the fins 17 are scraped off.

According to the cooling device and electronic apparatus of the modification, dusts are scraped by vertically reciprocating the wire 30, and hence the cleaning efficiency is improved.

Second Modification of the Second Embodiment

Figure 17:
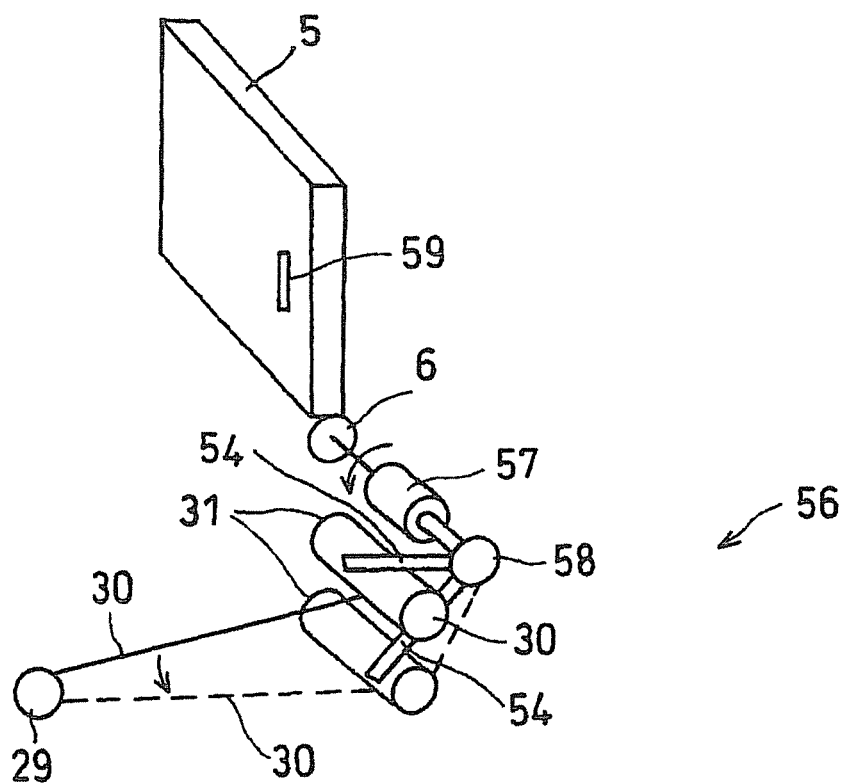
FIG. 17 is an exploded perspective view of main portions of a dust removing mechanism of a cooling device of a second modification of the second embodiment of the invention.

The cooling device may be configured so that the driving motor which produces the driving force for driving the swinging of the hinge portion 6 is disposed in the hinge portion 6. FIG. 17 is an exploded perspective view of main portions of a dust removing mechanism of a cooling device of a second modification of the second embodiment of the invention. The dust removing mechanism 56 includes: a small driving motor 57 which is disposed in the hinge portion 6; an abutting member 58 having the arm portion 54 which abuts against an upper portion of the first roller 31; and a switch button 59 which turns on of off rotation of the driving motor 57. The shaft of the driving motor 57 is coupled to a component constituting the hinge portion 6. When turned on by the switch button 59, the driving motor 57 starts to rotate, and, when turned off by the switch button 59, the driving motor 57 stops the rotation driving.

According to the configuration, when the user presses the switch button 59, the shaft of the driving motor 57 starts to rotate in a counterclockwise direction as viewed toward a face of the hinge portion 6. The shaft of the motor is rotated until the opening angle is increased from 0 deg. to a swing angle corresponding to the upstanding angle, and then stops. The wire 30 is moved from the upper side to the lower side, and dusts adhering to the end edges of the fins 17 which are not shown are scraped off. During a period when the shaft is rotated in a clockwise direction from the upstanding angle to the closing angle by an operation of the switch button 59, the wire 30 is moved from the lower side to the upper side to scrape off dusts, and the rotation of the shaft stops. The dust removing operation which is performed by the vertical movement of the wire 30 is controlled by the on or off operation of the switch which is performed by the user, irrespective of the opening or closing operation of the display unit. According to the cooling device and electronic apparatus of the modification, the user can perform an operation so as to prevent dusts from adhering to the heat exchanging portion 16.

In the cooling device and the electronic apparatus, the opening/closing state of the display unit 5 is changed in accordance with the position of the rotation angle of the shaft. The driving of the driving motor 57 is independent from the opening/closing operation of the display unit 5. The motor which is the driving mechanism is disposed in order to change the opening/closing state in accordance with the position of the rotation angle of the shaft. The motor is disposed in, for example, the hinge mechanism portion, so that the rotation driving force can be produced without ensuring the space corresponding to the volume of the motor in the case 2. The cleaning operation by the vertical movement of the wire 30 is performed irrespective of the opening/closing operation of the display unit 5, and the rotating or stopping operation of the motor is performed in conjunction with the on or off operation by user. Since the driving motor 57 is incorporated in the hinge portion 6, the sizes of mechanism components for transmitting a power can be reduced. The rotation force can be transmitted to the hinge portion 6 without using components for a power transmitting mechanism such as a belt. According to the cooling device and electronic apparatus of the modification, the number of components can be remarkably reduced as compared with that required in the case where the same function is realized by disposing components for a power transmitting mechanism in the case 2. In an assumed case where a mechanism for removing dusts is configured by using a driving motor disposed below the keyboard, many components are disposed in the case 2, and therefore the space corresponding to the volume of the driving motor must be disposed in the case 2. In the cooling device of the modification, the driving force can be produced without using the built-in space for the motor in the case 2. In the electronic apparatus having the cooling device, the fins 17 can be cleaned simply by operating the switch button 59 by the user.

Furthermore, opening/closing detector for detecting opening of the display unit 5 may be attached to the electronic apparatus. In this case, a mechanism which, when the display unit 5 is opened, causes the driving motor 57 to start to rotate may be mounted so that, each time when the user opens the display unit, the driving motor 57 is driven, whereby the end edges of the fins 17 are cleaned each time when the opening/closing operation is performed.

The switching timing of the driving motor 57 can be variously changed. The timing may be set to, for example, a timing when the user operates the switch, or that when the display unit 5 is opened. In a personal computer which is operated for 24 hours a day, for example, the cleaning operation may be performed at a timing of one time per day.

Third Embodiment

Figure 18:
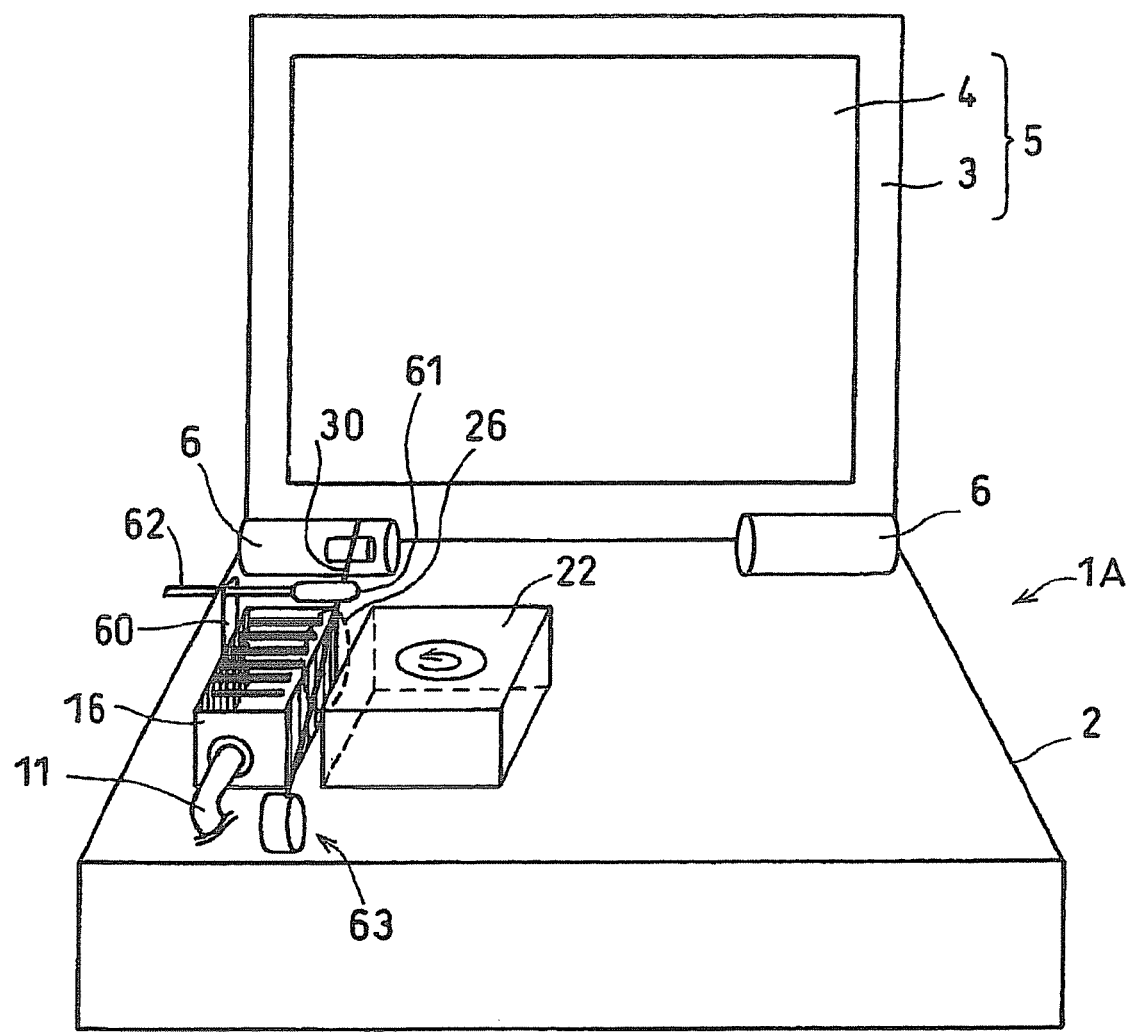
FIG. 18 is a perspective view of a dust removing mechanism of an electronic apparatus having a cooling device of a third embodiment of the invention, as viewed toward the front.
Figure 19:
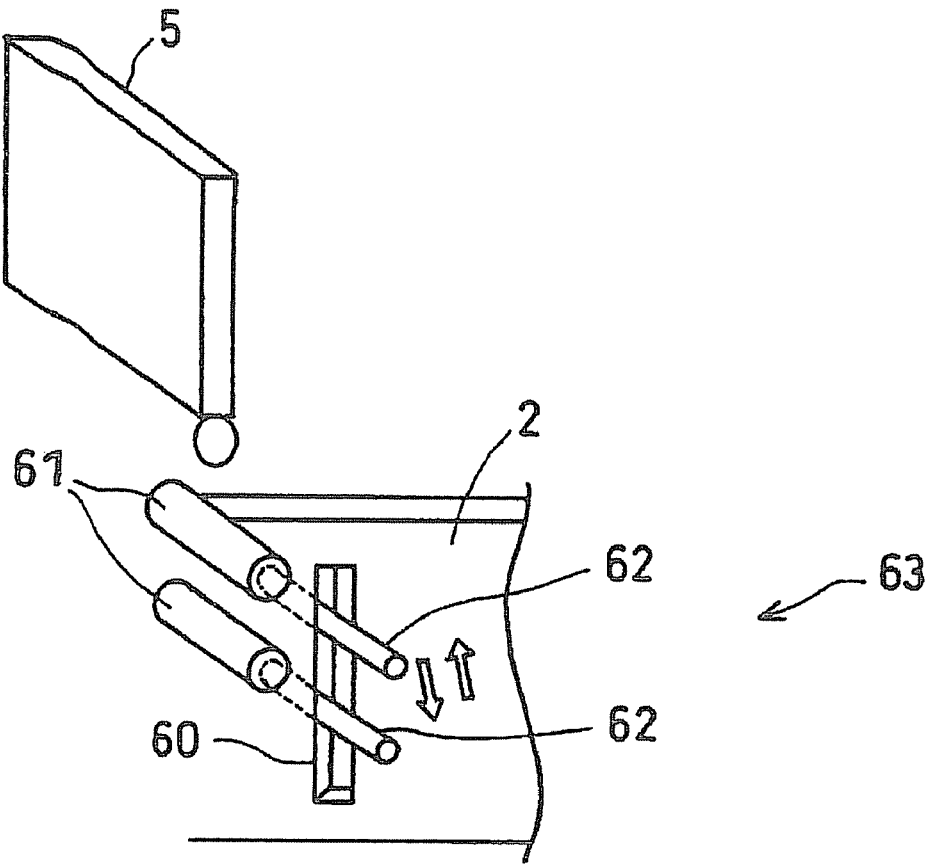
FIG. 19 is an exploded perspective view of main portions of the dust removing mechanism of the cooling device of the third embodiment of the invention.
Figure 20:
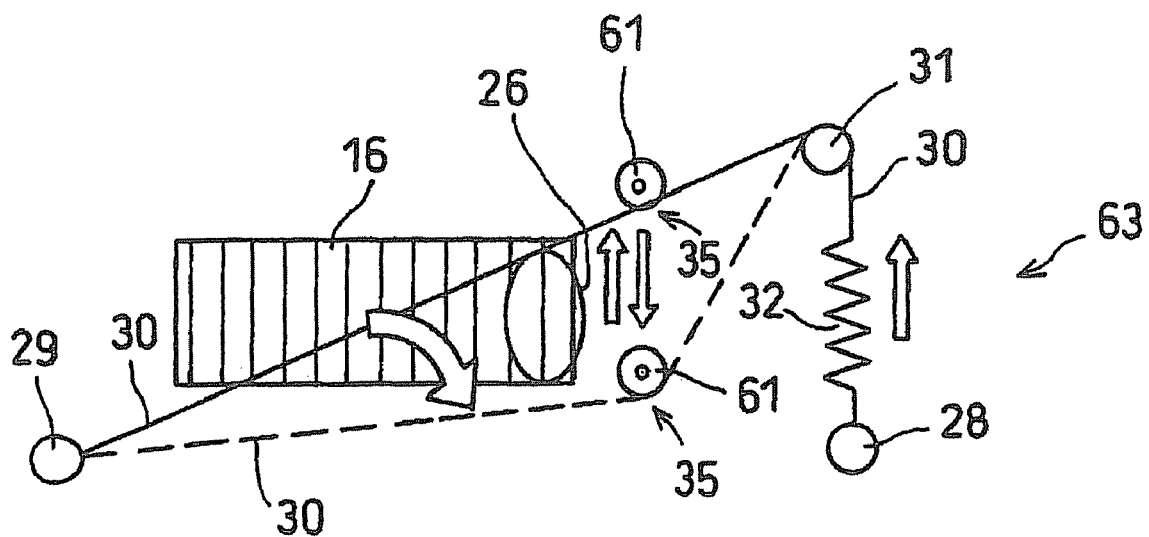
FIG. 20 is a diagram of the dust removing mechanism of the cooling device of the third embodiment of the invention.

The cooling device may be configured so that the wire 30 is moved by using a manual mechanism. FIG. 18 is a perspective view of a dust removing mechanism of an electronic apparatus having a cooling device of a third embodiment of the invention, as viewed toward the front, FIG. 19 is an exploded perspective view of main portions of the dust removing mechanism of the cooling device of the embodiment, and FIG. 20 is a diagram of the dust removing mechanism, as viewed from the fan unit 22 to the heat exchanging portion 16. In the figures, the components denoted by the same reference numerals as those described above are identical with the components which are denoted by the reference numerals in the above.

An opening 60 which is vertically elongated is formed in the left side wall in a front view of the case 2 of the electronic apparatus 1A. The wire 30 has the spring portion 32, one end of the wire is fixed to the first fixing portion 28 which is not shown, the other end is fixed to the second fixing portion 29, and the wire is wound around a wound portion which is not shown, whereby a tension is applied to the wire. A roller portion 61 is a movable member which applies an urging force opposed to an elastic force due to the spring portion and the tension, to the middle portion of the wire 30, and which has a coaxial two-layer configuration. The roller portion 61 is configured by a basal shaft portion, and an outer sheath portion which is slidable with respect to the outer circumferential face of the basal shaft portion. One end of a press knob 62 is attached to the basal shaft portion of the roller portion 61. The other end of the press knob 62 is exposed to the outside of the case 2 through the opening 60. The roller portion 61 and the press knob 62 function as driving mechanism for driving the roller portion 61 between two upper and lower positions. The first fixing portion 28, the second fixing portion 29, the wound portion, the wire 30, the roller portion 61, and the press knob 62 constitute the dust removing mechanism 63.

In the thus configured dust removing mechanism 63, usually, the roller portion 61 is upward urged by the restoring force of the spring portion of the wire 30, and the basal shaft portion of the roller portion 61 is held by the upper edge of the opening 60. When the user is to remove dusts, the user grips the press knob 62, and presses down the press knob 62 against the urging force. The user presses down the press knob 62 until the press knob 62 bumps against the lower edge of the opening 60. While using the pressing force of the user as a driving source, the press knob 62 is downward driven along one side edge of the longitudinal direction of the opening 60. In conjunction with this, the middle portion of the wire 30 is pressed down in a state where the middle portion functions as a point of force and the other end of the wire 30 functions as a fulcrum. The intermediate portion of the wire 30 is swingably driven while the second fixing portion 29 functions as a fulcrum, and dusts adhering to a generally triangular region in the plane including the end edges of the fins 17 are removed. When the user releases the hand from the press knob 62, the manual pressing force applied to the press knob 62 is canceled. The press knob 62 is raised from the lower side toward the upper side, and dusts are scraped also during the rising operation. The movement of the press knob 62 is limited and stopped by the upper edge of the opening 60, and the press knob 62 is again held to the usual state.

According to the cooling device and electronic apparatus of the embodiment of the invention, removal of dusts can be directly performed in response to an operation by the user.

Fourth Embodiment

Figure 21:
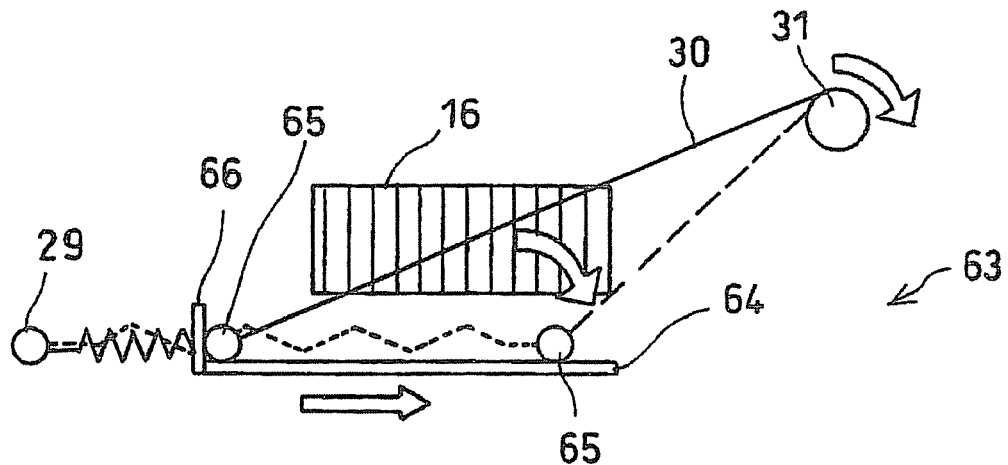
FIG. 21 is a diagram of a dust removing mechanism of a cooling device of a fourth embodiment of the invention.

The dust removing mechanism may use a wire take-up mechanism which takes up the wire 30. FIG. 21 is a diagram of a dust removing mechanism of a cooling device of a fourth embodiment of the invention, showing the dust removing mechanism 63 as viewed from the fan unit 22 to the heat exchanging portion 16. Also an electronic apparatus having the cooling device of the embodiment is a notebook personal computer having the cooling device, and has the same cooling components as the example of the electronic apparatus 1 of the first embodiment. The first roller 31 is attached to a shaft of a motor which is not shown, and configured so as to take up the wire 30 and cancel the taking up by means of rotational driving of the motor. The first roller 31 and the motor constitute the wire take-up mechanism.

The dust removing mechanism 63 has the second fixing portion 29, the first roller 31, and the wire 30, and further includes: a one-way guiding member 64 which is disposed fixedly with respect to the heat exchanging portion 16, and which has a substantially linear portion that is parallel to the arrangement direction of the fins 17 in the plane including the end edges of the fins 17; a wire fixing member 65 which is rollable or slidable along the substantially linear portion of the one-way guiding member 64; and a restricting member 66 which restricts movement of the wire fixing member 65. The restricting member 66 upstands at the left end of the one-way guiding member 64, and restricts the leftward movement of the wire fixing member 65. A hole is opened in the restricting member 66. The wire 30 is passed through the hole.

According to the configuration, when the first roller 31 is rotationally driven so as to take up the wire 30, the wire fixing member 65 is rightward moved, and the wire 30 is moved while sliding over the end edges of the fins 17 which is a cooling module, thereby scraping off dusts adhering to the end edges. When the taking up of the wire 30 by the first roller 31 is canceled thereafter, the force of pulling the wire fixing member 65 is removed, and the wire fixing member 65 is rapidly returned toward the left side by restoring force of the spring. The wire fixing member 65 bumps against the restricting member 66 which is the left stroke end, whereby the wire 30 is vibrated, and dusts adhering to the wire 30 are caused to drop by a sudden acceleration change.

According to the cooling device and electronic apparatus of the embodiment of the invention, both the removal of dusts adhering to a generally triangular region in the plane including the end edges of the fins 17, and the application of vibrations to the wire 30 can be simultaneously performed.

Vibrator may be disposed in the cooling device and the electronic apparatus to vibrate the wire 30, or a brush-like member may be used to remove dusts.

First Modification of the Fourth Embodiment

Figure 22:
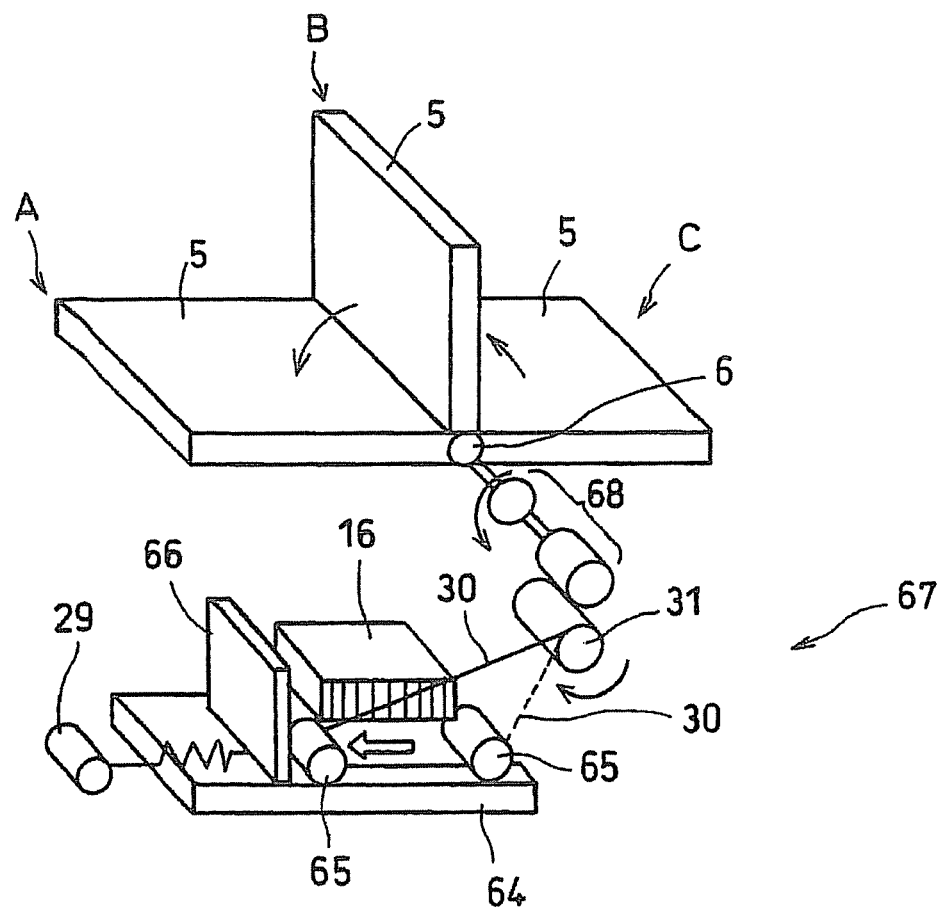
FIG. 22 is an exploded perspective view of main portions of a dust removing mechanism of a cooling device of a first modification of the fourth embodiment of the invention.

As the driving force of the wire take-up mechanism, the driving force which is applied to the hinge portion 6 in the opening/closing operation may be used. FIG. 22 is an exploded perspective view of main portions of a dust removing mechanism of a cooling device of a first modification of the fourth embodiment of the invention. The dust removing mechanism 67 includes the second fixing portion 29, the first roller 31, the wire 30, the one-way guiding member 64, the restricting member 66, a driving force transmitting system 68 in which a one-way clutch is disposed in a middle portion, and the wire fixing member 65. The first roller 31 is rotationally driven by the driving force transmitting system 68. The driving force transmitting system 68 is configured so as to transmit the driving force to the first roller 31, only when the opening angle of the hinge portion 6 is a rotation angle in the range between first and second rotation angles in the total rotation angle of 360 deg.

According to the configuration, during an operation of closing the display unit 5 from the flattened state C or the upstand state B to the state A, the driving force transmitting system 68 is rotated in a counterclockwise direction, and the first roller 31 is rotated in a clockwise direction, thereby taking up the wire 30. In conjunction with this, the wire fixing member 65 is rightward displaced in a state where the member is restricted to one direction. The wire 30 is displaced from the upper side to the lower side, and the intermediate portion of the wire 30 scrapes off dusts adhering to the end edges of the fins 17. By contrast, during an operation of opening the display unit 5 from the state A to the state B or the state C, the driving force transmitting system 68 is rotated in a clockwise direction, and the first roller 31 is rotated in a counterclockwise direction. The wire fixing member 65 is leftward pulled by the spring in the state where the member is restricted to one direction. In conjunction with this, the wire 30 is displaced from the lower side to the upper side, and the intermediate portion of the wire 30 scrapes off dusts adhering to the end edges of the fins 17. Only in the range required for taking up of the wire in 360 deg., the rotations are engaged with each other, and, outside the engaged range, the wire 30 is returned to the initial position by the spring.

According to the cooling device and electronic apparatus of the modification, dusts are scraped by vertically reciprocating the wire 30, and hence the cleaning efficiency is improved.

Second Modification of the Fourth Embodiment

Figure 23:
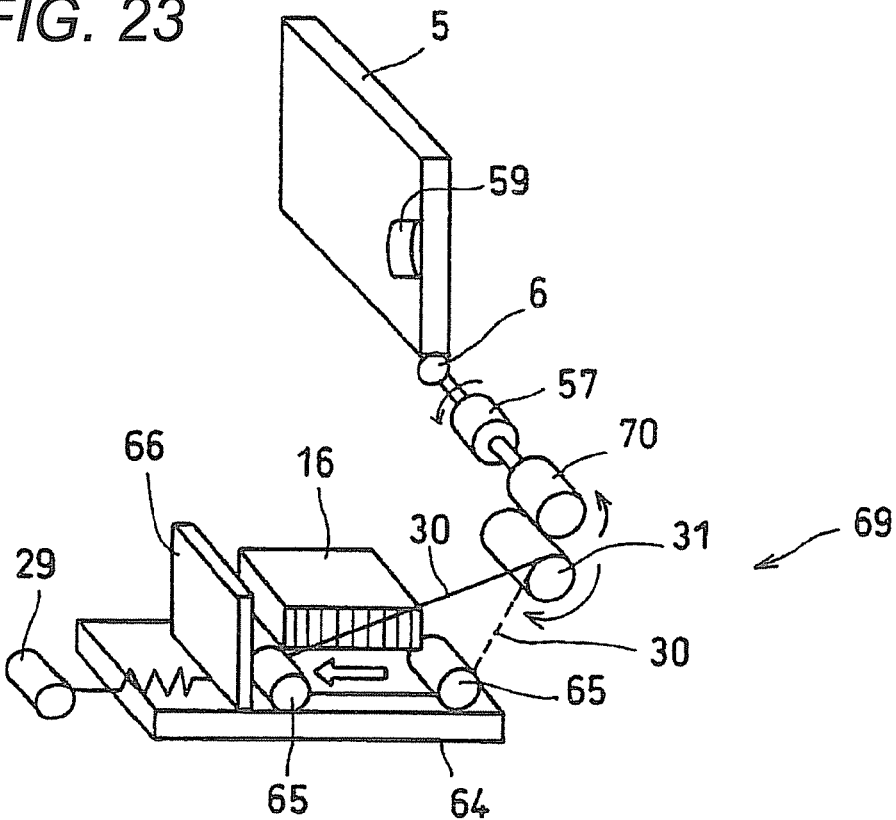
FIG. 23 is an exploded perspective view of main portions of a dust removing mechanism of a cooling device of a second modification of the fourth embodiment of the invention.

As the driving force of the wire take-up mechanism, a driving motor which is disposed in the hinge portion 6 may be used. FIG. 23 is an exploded perspective view of main portions of a dust removing mechanism of a cooling device of a second modification of the fourth embodiment of the invention. The dust removing mechanism 69 includes the hinge portion 6, the second fixing portion 29, the first roller 31, the wire 30, the one-way guiding member 64, the wire fixing member 65, the restricting member 66, a roller 70, and the small driving motor 57 which is disposed in the hinge portion 6. The rotation shaft of the roller 70 is parallel to that of the first roller 31. The driving motor 57 rotationally drives the roller 70, and the roller 70 rotationally drives the first roller 31.

According to the configuration, when the user presses the switch button 59, controller which is not shown causes the driving motor 57 to rotate. In a manner similar to the example of FIG. 22, the intermediate portion of the wire 30 scrapes off dusts adhering to the end edges of the fins 17. Since the driving motor 57 is incorporated in the hinge portion 6, the sizes of mechanism components for transmitting a power can be reduced.

Third Modification of the Fourth Embodiment

Figure 24:
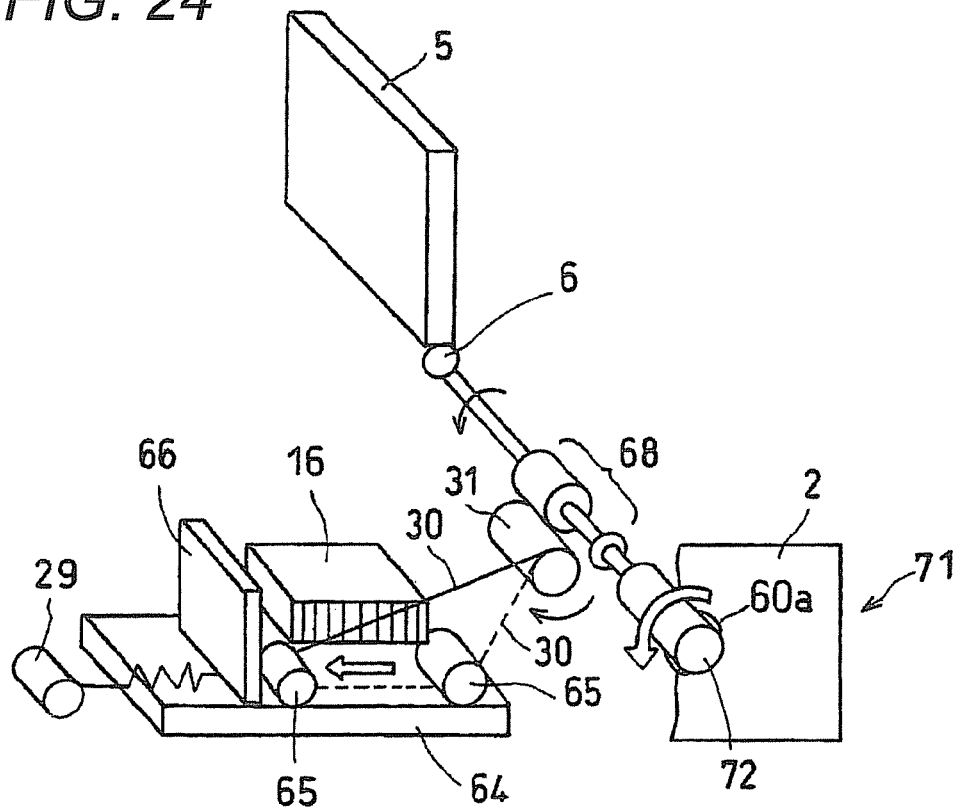
FIG. 24 is an exploded perspective view of main portions of a dust removing mechanism of a cooling device of a third modification of the fourth embodiment of the invention.

As the driving force of the wire take-up mechanism, a manual mechanism may be used. FIG. 24 is an exploded perspective view of main portions of a dust removing mechanism of a cooling device of a third modification of the fourth embodiment of the invention. The dust removing mechanism 71 includes the second fixing portion 29, the first roller 31, the wire 30, the one-way guiding member 64, the wire fixing member 65, the restricting member 66, the driving force transmitting system 68, and a rotation knob 72 which is exposed from the interior to the outside through an opening 60a. The rotation knob 72 is coupled to the driving force transmitting system 68 to be interlocked therewith, so that, when the rotation knob 72 is operated, a rotation driving force is transmitted to the driving force transmitting system 68. The driving force transmitting system 68 has a one-way clutch. Reverse rotation of the rotation knob 72 is restricted by the one-way clutch.

According to the configuration, when the user rotationally operates the rotation knob 72, the intermediate portion of the wire 30 scrapes off dusts adhering to the end edges of the fins 17 in the same manner as the example shown in FIGS. 18 to 20. According to the cooling device and electronic apparatus of the modification, dusts can be removed also by using a manual rotation force of the rotation knob 72 exerted by the user, as the driving force.

Fifth Embodiment

In the electronic apparatus, detector for detecting that the cooling performance of the cooling device is reduced may be disposed, and, when the cooling performance is reduced, an alarm indicative of this may be output. Also an electronic apparatus of a fifth embodiment of the invention is a notebook personal computer having a cooling device, and has the same cooling components as the example of the electronic apparatus 1 of the first embodiment.

The electronic apparatus includes: a plurality of temperature sensors which are disposed in plural places of the printed circuit board 7, respectively, and which output temperature information; a memory which stores temperature information of the places in a normal state; detector which calculates the difference between temperatures in, for example, two places on the board on the basis of the outputs of the temperature sensors, and which compares the calculated temperature difference with the temperature difference between the same two places in a normal state, thereby detecting whether the temperature difference between the same two places is larger than a predetermined value or not; and controller which, when the detector detects that the temperature difference is larger, determines that one of the two places generates heat, and issues a warning of reduction of the cooling performance.

The abnormality detecting method using a temperature difference pattern uses a phenomenon that the pattern of a temperature difference between specific two places on the board, or that between plural places in the case 2 is changed between a state where the air flow is blocked, and the stationary state. The controller calculates the temperature difference between the temperature sensors, based on the temperature information obtained from the temperature sensors, and determines whether the cooling device is in the blocked state or in the stationary state, on the basis of the temperature difference or a change of the temperature difference pattern.

Figure 25:
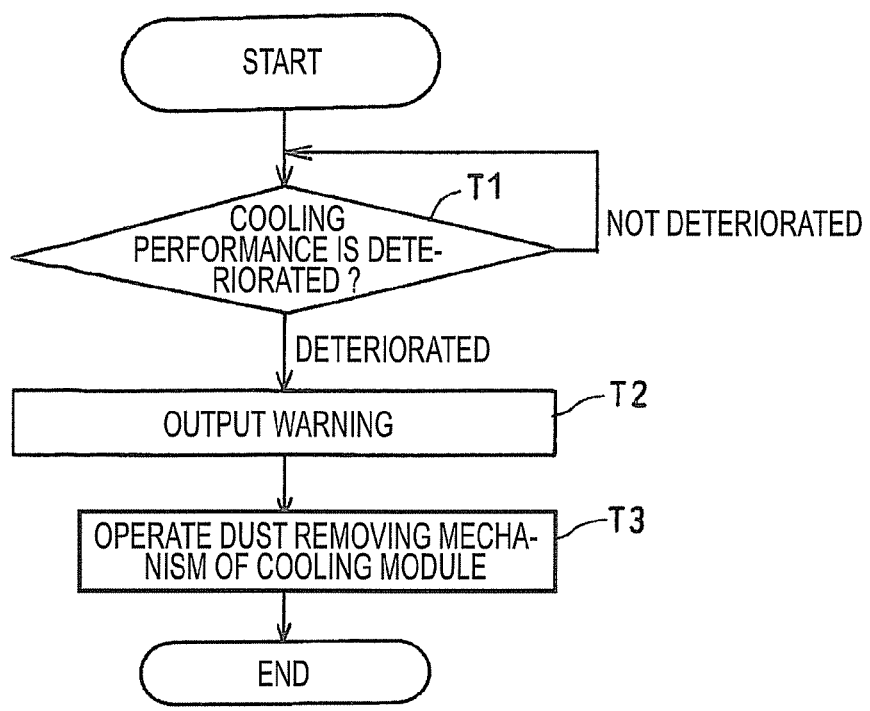
FIG. 25 is a flowchart illustrating a function of diagnosing reduction of the cooling performance of a cooling device in a fifth embodiment of invention.
Figure 26:
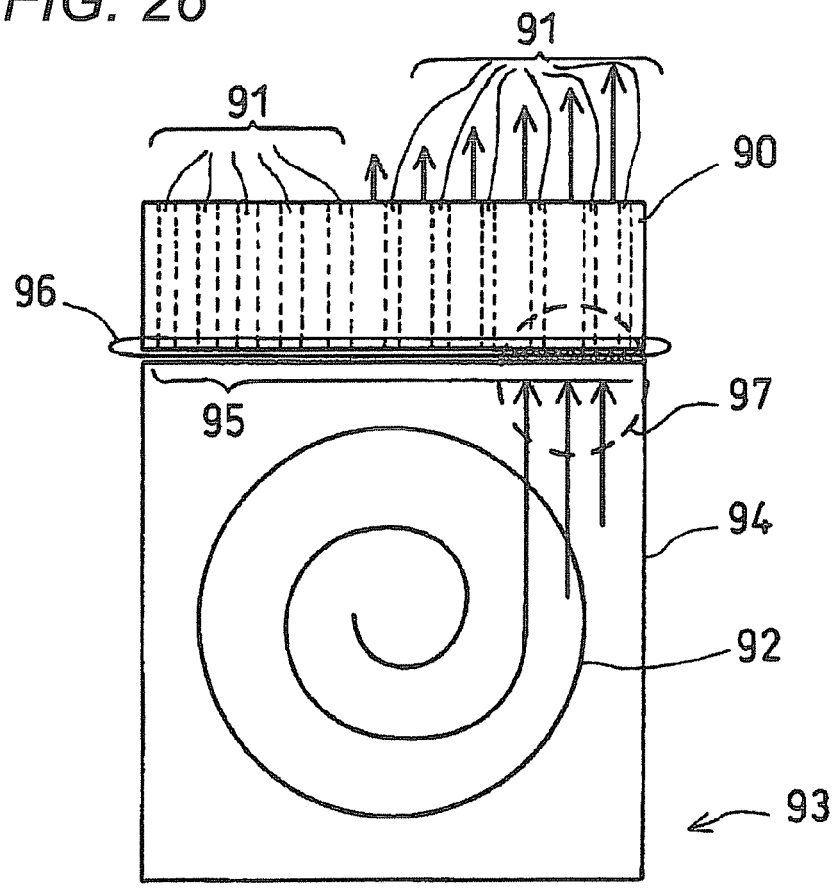
FIG. 26 is a view showing the positional relationships between a heat exchanging portion and a fan unit, and a blowing air passage in the case where the heat exchanging portion and the fan unit are viewed from the upper side.

According to the configuration, the controller monitors the pattern of the temperature difference between the plural places in the case 2, for a predetermined time period. FIG. 25 is a flowchart illustrating the function of diagnosing reduction of the cooling performance of the cooling device in the fifth embodiment of the invention.

In step T1, the controller performs a process of detecting that the cooling performance is reduced or not. When dusts accumulate on the end edges of the fins 17, for example, the controller detects, on the basis of temperature information from a temperature sensor disposed in the vicinity of the heat exchanging portion 16, that the temperature difference in the vicinity of the portion is larger than the temperature differences in the other places.

In step T1, during a period when abnormality is not detected, the controller continues to perform the detection process while the control passes through the route labeled Non-detection. If the controller detects abnormality in step T1, the control passes through the route labeled Detection, and the controller issues the warning in step T2. In step T3, the controller instructs the dust removing mechanism to perform driving, thereby causing the dust removing mechanism to perform the operation of removing dusts adhering to the end edges of the fins 17. In step T3, the dust removing mechanism removes dusts by moving the wire 30, vibrating the wire 30, or moving the wire 30 while vibrating the wire.

According to the cooling device and electronic apparatus of the embodiment of the invention, it is possible to detect whether the cooling performance is reduced by dusts accumulating in the case 2 or not, and, if detected, dusts can be automatically removed.

Modification of the Fifth Embodiment

Alternatively, the electronic apparatus of the fifth embodiment of the invention may be configured so as to include: a memory which stores the relationship between the current value of the signal supplied to the fan 23 and the number of rotations of the fan 23; and controller which always monitors the number of rotations of the fan 23 to monitor the driving state of the fan 23. In the configuration, the controller determines whether the fan 23 operates at an adequate number of rotations with respect to the current value of the signal supplied to the fan 23 or not. If the number of rotations exceeds a threshold, the controller determines that the rotation status of the fan 23 is abnormal, and issues a warning of reduction of the cooling performance. Alternatively, the controller detects that the number of rotations of the fan is abnormally increased.

In the cooling device of the fifth embodiment of the invention, the function of diagnosing reduction of the cooling performance may be configured by using a member disposed in the case 2, such as the wire 30. In the case where a large amount of dusts adheres to the wire 30, for example, the temperature of the wire 30 is raised, and hence the electric resistance and spring force of the wire 30 are changed. The controller detects the electric resistance or the degree of the spring force, and diagnoses reduction of the cooling performance. In order to realize the function, means for measuring the electric resistance of the wire 30 is disposed in the cooling device. If the controller determines that the resistance exceeds a previously held threshold, it is detected that a large amount of dusts adhere to the wire 30, and the dust removing mechanism is operated.

Other Examples

The shape of the fins 17, the positions where the fins 17 are arranged, and the like can be variously changed. According to the cooling device of the embodiment of the invention, also in a heat exchanging portion where fins are disposed in a different shape or different arrangement positions, dusts adhering to the fins are removed in the same method as described above.

The cooling device of the embodiment of the invention can cool a heat exchanger having a configuration where fins are not disposed. The cooling device includes: a centrifugal fan; a heat exchanger having no fin; a fan case having a blowing air passage through which cooling air from the fan is blown to the heat exchanger; and a dust removing mechanism. The dust removing mechanism scrapes off dusts which biasedly adhere to the heat exchanger. In the case where components constituting the dust removing mechanism have a pipe- or box-like shape, the cooling air inlet of the heat exchanger is a surface portion to which the cooling air is blown. In the case where the heat exchanger has a plurality of heat radiating plates, or where the heat exchanger has a fin-like, concavo-convex, or groove-like portion as a heat radiating portion, the cooling air inlet of the heat exchanger is the radiating plates, or fin-like, concavo-convex, or groove-like portion which is situated in a flow path of the cooling air. Also in the configuration, the dust removing mechanism can remove dusts adhering to the heat exchanger, and the cooling device and the electronic apparatus can achieve the same effects as described above.

The embodiments described above are configured so that the dust removing mechanism cools the heat exchanging portion 16. In the cooling device of the embodiment of the invention, cooled components other than the heat exchanging portion 16 can be cooled. The cooling device may be configured so that the dust removing mechanism cools cooled components other than the heat exchanging portion 16, such as a heat diffusing member or a heat radiating member. Many cooled components such as a semiconductor chip itself, and members attached to the heat pipe 11 thermally connected thereto are disposed in the case. A gap is formed between such a cooled component and the fan unit, and dusts adhere to the gap and a surface portion of the cooled component. The dust removing mechanism scrapes off the dusts by means of the above-described displacement driving of the wire 30. The descriptions of the above embodiments are directed to the case where the cooled component or a to-be-cooled component is the heat exchanging portion 16 having the fins 17. The dust removing mechanism sweeps dusts adhering to cooled components such as a heat exchanging portion not having the fins 17, a heat diffusing member, a heat radiating member, and a heat transferring member, in a similar manner as the examples where the generally triangular region is swept. In an electronic apparatus, a component which must be cooled surely exists in a case. In the case where dusts tends to adhere to a surface portion of such a component by the rotation of the fan, the dust removing mechanism scrapes off dusts adhering to the surface portion, in a similar manner as described above.

It is to be understood that the present invention is not limited to the specific embodiments described above and that the present invention can be embodied with the components modified without departing from the spirit and scope of the present invention. The present invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. A cooling device comprising:
   a fan configured to rotate and produce airflow;
   a fan case accommodating the fan, the fan case having an outlet for discharging the airflow produced by the fan;
   a heat exchanger having an inlet disposed to oppose the outlet of the fan case, the inlet being configured to take in the airflow discharged from the outlet;
   a wire disposed between the heat exchanger and the fan case to stretch along an end face of the inlet of the heat exchanger, the wire having a first end being fixed to a fulcrum and a second end; and
   a wire driving mechanism configured to swing the wire about the fulcrum to scrape the end face of the inlet of the heat exchanger by the wire.

2. The device of claim 1 further comprising a vibrator configured to apply vibrations to the wire.

3. The device of claim 1, wherein the wire driving mechanism comprises:
   a movable member being formed with a rough pattern is formed; and
   a mechanism configured to swing the wire about the fulcrum while bringing the wire in contact with the rough pattern to vibrate the wire.

4. The device of claim 1, wherein the wire is formed as a brush comprising a core member and a bristle member embedded to the core member.

5. An electronic apparatus comprising:
   a case comprising a side wall in which an air discharge port is formed; and
   a cooling device provided in the case, the cooling device comprising:
   a fan configured to rotate and produce airflow;
   a fan case accommodating the fan, the fan case having an outlet for discharging the airflow produced by the fan;
   a heat exchanger disposed near the air discharge port and having an inlet disposed to oppose the outlet of the fan case, the inlet being configured to take in the airflow discharged from the outlet;
   a wire disposed between the heat exchanger and the fan case to stretch along an end face of the inlet of the heat exchanger, the wire having a first end being fixed to a fulcrum and a second end; and a wire driving mechanism configured to swing the wire about the fulcrum to scrape the end face of the inlet of the heat exchanger by the wire.

6. The apparatus of claim 5, wherein the case further comprises a first case, a second case, and a hinge connecting the first case and the second case, and wherein the wire driving mechanism comprises a wire member coupled to the hinge and the wire, the wire member being configured to swing the wire about the fulcrum when being wound or unwound by the hinge.

7. The apparatus of claim 5 further comprising a detector configured to detect a deterioration of a cooling performance of the heat exchanger, wherein the wire driving mechanism is configured to swing the wire about the fulcrum when the detector detects the deterioration.

8. The apparatus of claim 5, wherein the wire driving mechanism is configured to swing the wire about the fulcrum when a power supply of the apparatus is turned on or off.

9. The apparatus of claim 5 further comprising a speaker provided in the case, wherein the first end of the wire is fixed to the speaker to transmit vibrations of the speaker to the wire.

* * * * *